United States Patent
Fukuhara et al.

(10) Patent No.: US 10,565,458 B2
(45) Date of Patent: Feb. 18, 2020

(54) SIMULATION SYSTEM, SIMULATION PROGRAM AND SIMULATION METHOD

(71) Applicant: Advanced Data Controls Corp., Chiyoda-ku, Tokyo (JP)

(72) Inventors: Takahiro Fukuhara, Tokyo (JP); Yasuyuki Nakanishi, Tokyo (JP); Takashi Kawahara, Tokyo (JP)

(73) Assignee: Advanced Data Controls Corp., Chiyoda-ku, Tokyo (JP)

( * ) Notice: Subject to any disclaimer, the term of this patent is extended or adjusted under 35 U.S.C. 154(b) by 0 days.

(21) Appl. No.: 16/367,257

(22) Filed: Mar. 28, 2019

(65) Prior Publication Data

US 2019/0220029 A1     Jul. 18, 2019

Related U.S. Application Data

(63) Continuation of application No. PCT/JP2017/033728, filed on Sep. 19, 2017.

(30) Foreign Application Priority Data

| Oct. 6, 2016 | (JP) | ................................. | 2016-197999 |
| May 9, 2017 | (JP) | ................................. | 2017-092949 |

(51) Int. Cl.
  *G05D 1/02* (2006.01)
  *G05D 1/00* (2006.01)
  (Continued)

(52) U.S. Cl.
  CPC ....... *G06K 9/00791* (2013.01); *G05D 1/0088* (2013.01); *G05D 1/0221* (2013.01);
  (Continued)

(58) Field of Classification Search
  CPC .. G05D 1/0221; G05D 1/0251; G05D 1/0088; G05D 1/0268; G05D 1/0246;
  (Continued)

(56) References Cited

U.S. PATENT DOCUMENTS

| 9,606,539 B1 * | 3/2017 | Kentley | ................. | G01S 17/023 |
| 9,632,502 B1 * | 4/2017 | Levinson | .............. | G01S 7/4972 |

(Continued)

FOREIGN PATENT DOCUMENTS

| JP | 2004-355272 A | 12/2004 |
| JP | 2007-66045 A | 3/2007 |

(Continued)

OTHER PUBLICATIONS

International Search Report for PCT/JP2017/033728 dated Dec. 19, 2017.

(Continued)

*Primary Examiner* — Mussa A Shaawat
(74) *Attorney, Agent, or Firm* — Yokoi & Co., U.S.A.; Toshiyuki Yokoi

(57) ABSTRACT

This vehicle synchronization simulation device and means is provided with: a means for calculating positional information of the own vehicle; a means for transmitting the own vehicle positional information to a server means; a means for converting the own vehicle positional information into a specific data format and transmitting the same; a means for transferring the data via a network or a transmission bus inside of a specific device; a means for receiving the data and generating an image; a means for recognizing and detecting a specific object from the generated image; and a means for changing/correcting positional information of the own vehicle using the information resulting from recognition. The server means is provided with a means that synchronously controls three means, a own vehicle position calculating means, a transmitting/receiving means, and an image generating/recognizing means.

14 Claims, 15 Drawing Sheets

(51) Int. Cl.

| | |
|---|---|
| *G06F 17/50* | (2006.01) |
| *G06K 9/00* | (2006.01) |
| *G06N 3/08* | (2006.01) |
| *G06K 9/62* | (2006.01) |
| *G06T 7/55* | (2017.01) |
| *G06T 15/00* | (2011.01) |
| *G06T 17/05* | (2011.01) |

(52) U.S. Cl.
CPC ......... *G05D 1/0251* (2013.01); *G05D 1/0268* (2013.01); *G06F 17/5009* (2013.01); *G06K 9/00342* (2013.01); *G06K 9/00805* (2013.01); *G06K 9/00979* (2013.01); *G06K 9/6256* (2013.01); *G06K 9/6264* (2013.01); *G06K 9/6274* (2013.01); *G06N 3/08* (2013.01); *G06T 7/55* (2017.01); *G06T 15/005* (2013.01); *G06T 17/05* (2013.01); *G05D 1/0242* (2013.01); *G05D 1/0246* (2013.01); *G05D 2201/0213* (2013.01); *G06F 17/5095* (2013.01); *G06T 2207/10028* (2013.01); *G06T 2207/20081* (2013.01); *G06T 2207/30252* (2013.01)

(58) Field of Classification Search
CPC ............. G05D 1/0242; G06K 9/00791; G06K 9/00805; G06K 9/6264; G06K 9/6256; G06N 3/08; G06T 17/05; G06T 15/005; G06T 7/55; G06T 2207/20081; G06T 2207/30252; G06T 2207/10028
See application file for complete search history.

(56) References Cited

U.S. PATENT DOCUMENTS

| | | | |
|---|---|---|---|
| 9,720,415 B2 * | 8/2017 | Levinson | ................ G01S 17/42 |
| 9,733,342 B1 * | 8/2017 | Brown | .................. G01S 7/4052 |
| 9,734,455 B2 * | 8/2017 | Levinson | ............. G05D 1/0088 |
| 9,754,490 B2 * | 9/2017 | Kentley | ............. G06K 9/00805 |
| 9,910,441 B2 * | 3/2018 | Levinson | ............. G05D 1/0088 |
| 10,248,119 B2 * | 4/2019 | Kentley-Klay | .... B60H 1/00735 |
| 2007/0103463 A1 | 5/2007 | Beniyama et al. | |
| 2014/0341421 A1 | 11/2014 | Porikli et al. | |
| 2015/0210293 A1 | 7/2015 | Fletcher | |
| 2016/0098606 A1 | 4/2016 | Nakamura et al. | |
| 2016/0247290 A1 | 8/2016 | Liu et al. | |
| 2017/0126810 A1 * | 5/2017 | Kentley | ................ H04L 67/125 |
| 2017/0313297 A1 | 11/2017 | Okada et al. | |
| 2018/0060725 A1 * | 3/2018 | Groh | .................... G06N 3/0454 |
| 2019/0228571 A1 * | 7/2019 | Atsmon | .................. G06T 17/05 |

FOREIGN PATENT DOCUMENTS

| | | |
|---|---|---|
| JP | 2014-229303 A | 12/2014 |
| JP | 2015-141721 A | 8/2015 |
| JP | 2016-99635 A | 5/2016 |
| JP | 2016-157434 A | 9/2016 |
| WO | 2015/001878 A | 1/2015 |

OTHER PUBLICATIONS

PCT written opinion dated Dec. 19, 2017.
Yoshio Matsumoto, et al., Proposal of Mobile Robot Simulator Using VR Technology and Its Application to View-Based Robot Navigation, Journal of the Robotics Society of Japan, vol. 20, No. 5, pp. 497-505, Jul. 15, 2002.

* cited by examiner

SIMULATION SYSTEM, SIMULATION PROGRAM AND SIMULATION METHOD

CROSS-REFERENCES TO RELATED APPLICATIONS

This Application claims the benefit of priority and is a Continuation application of the prior International Patent Application No. PCT/JP2017/033728, with an international filing date of Sep. 19, 2017, which designated the United States, and is related to the Japanese Patent Application No. 2016-197999, filed Oct. 6, 2016 and Japanese Patent Application No. 2017-092949, filed May 9, 2017, the entire disclosures of all applications are expressly incorporated by reference in their entirety herein.

BACKGROUND OF THE INVENTION

1. Field of the Invention

The present invention relates to a simulation system, a simulation program and a simulation method of a recognition function module for an image varying with position shifting information of a vehicle.

2. Description of Related Art

At the present time, for the purpose of realizing automatic driving of vehicles such as ADAS (advanced driver assistance system) or the like to detect and avoid the possibility of an accident in advance, various tests have actively been conducted by recognizing images of a camera installed on a vehicle to detect objects such as other vehicles, walkers and a traffic signal in accordance with an image recognition technique to perform control to automatically decrease the speed of the vehicle and avoid the objects and the like. In the case of the above experiment system, it is particularly important to synchronously control the entire system with a real-time property and a high recognition rate.

An example of an automatic driving support system is a travel control system disclosed, for example, in Patent Document 1. The travel control system disclosed in this Patent Document 1 is aimed at realizing an automatic driving system with which an vehicle can travel on a predetermined traveling route by detecting road markings such as a lane marker, a stop position and the like around own vehicle on a road and detecting solid objects such as a plurality of mobile objects/obstacles located around the own vehicle to determine a traveling area on the road while avoiding collision with solid objects such as a traffic signal and a signboard.

Incidentally, for the purpose of performing control by recognizing an outside peripheral situation with onboard sensors, it is required to determine vehicles, bicycles and walkers which belong to categories of a plurality of mobile objects and a plurality of obstacles, and detects information about positions and speeds thereof. Furthermore, for driving own vehicle, it is required to determine the meanings of paints such as a lane marker and a stop sign on a road, and the meanings of traffic signs. As a vehicle-mounted camera for detecting outside information around own vehicle, it is considered effective to use an image recognition technique with an image sensor of a camera.

[Patent Document] Japanese Unexamined Patent Application Publication No. 2016-99635

BRIEF SUMMARY OF THE INVENTION

However, while it is practically impossible to collect test data by endlessly driving a vehicle in the actual world, it is an important issue how to carry out the above test with a sufficient reality of an actually substitutable level.

For example, in the case where an outside environment is recognized by an image recognition technique with camera images, the recognition rate is substantially changed by external factors such as the weather around own vehicle (rain, fog or the like) and the time zone (night, twilight, backlight or the like) to influence the detection result. As a result, with respect to mobile objects, obstacles and paints on a load around own vehicle, there are increased misdetection and undetection. Such misdetection and undetection of an image recognition means can be resolved with a deep leaning (machine learning) technique having a highest recognition rate by increasing the number of samples for learning.

However, it has a limit to extract learning samples during actually driving on a load, and it is not realistic as a development technique to carry out a driving test and sample collection after meeting severe weather conditions such as rain, backlight, fog or the like while such conditions are difficult to reproduce only with a rare opportunity.

On the other hand, for the purpose of realizing fully automatic driving in future, the above image recognition of camera images would not suffice. This is because camera images are two-dimensional images so that, while it is possible to extract objects such as vehicles, walkers and a traffic signal and the like by image recognition, three-dimensional profiles cannot be obtained. Accordingly, a sensor using a laser beam called LiDAR and a sensor using a millimeter wave band of radio waves are highly anticipated as means for dealing with the above issues. It is therefore possible to substantially improve the safety of a vehicle during driving by combining a plurality of different types of sensors.

In order to solve the problem as described above, the present invention is related to the improvement of the recognition rate of target objects such as other vehicles peripheral to own vehicle, obstacles on the road, and walkers, and it is an object of the present invention to improve reality of the driving test of a vehicle and sample collection by artificially generating images which are very similar to actually photographed images taken under conditions, such as severe weather conditions, which are difficult to reproduce, and provide a simulation system, a simulation program and a simulation method which can perform synchronization control with CG images generated by a CG technique by building a plurality of different types of sensors in a virtual environment.

In order to accomplish the object as described above, in accordance with the present invention, a simulation system of a recognition function module for an image varying in correspondence with position shifting information of a vehicle, comprises:

a positional information acquisition unit which acquires positional information of the vehicle;

an image generation unit which generates a simulation image for reproducing an area specified by the positional information on the basis of the positional information acquired by the positional information acquisition unit;

an image recognition unit which recognizes and detects a particular object by the recognition function module in the simulation image generated by the image generation unit;

a positional information calculation unit which generates a control signal for controlling behavior of the vehicle by the use of the recognition result of the image recognition unit, and changes/modifies the positional information of own vehicle on the basis of the generated control signal; and a synchronization control unit which controls synchronization among the positional information acquisition unit, the image generation unit, the image recognition unit and the positional information calculation unit.

Alternatively, the present invention is related to a simulator program of a recognition function module for an image varying in correspondence with position shifting information of a vehicle, causing a computer to function as:

a positional information acquisition unit which acquires positional information of the vehicle;

an image generation unit which generates a simulation image for reproducing an area specified by the positional information on the basis of the positional information acquired by the positional information acquisition unit;

an image recognition unit which recognizes and detects a particular object by the recognition function module in the simulation image generated by the image generation unit;

a positional information calculation unit which generates a control signal for controlling behavior of the vehicle by the use of the recognition result of the image recognition unit, and changes/modifies the positional information of own vehicle on the basis of the generated control signal; and a synchronization control unit which controls synchronization among the positional information acquisition unit, the image generation unit, the image recognition unit and the positional information calculation unit.

Furthermore, the present invention is related to a simulator method of a recognition function module for an image varying in correspondence with position shifting information of a vehicle, comprising:

a positional information acquisition step of acquiring positional information of the vehicle by a positional information acquisition unit;

an image generation step of generating, by an image generation unit, a simulation image for reproducing an area specified by the positional information on the basis of the positional information acquired in the positional information acquisition step;

an image recognition step of recognizing and detecting a particular object by the recognition function module in an image recognition unit in the simulation image generated in the image generation step;

a positional information calculation step of generating a control signal for controlling behavior of the vehicle by the use of the recognition result in the image recognition step and changing/modifying the positional information of own vehicle on the basis of the generated control signal, by a positional information calculation unit; and a synchronization control step of controlling synchronization among the positional information acquisition unit, the image generation unit, the image recognition unit and the positional information calculation unit by a synchronization control unit.

In the case of the above invention, it is preferred that the synchronization control unit comprises:

a unit of packetizing the positional information in a particular format and transmitting the packetized positional information;

a unit of transmitting the packetized data through a network or a transmission bus in a particular device;

a unit of receiving and depacketizing the packetized data; and a unit of receiving the depacketized data and generating an image.

In the case of the above invention, the synchronization control unit can transmit and receive signals among the respective units in accordance with UDP (User Datagram Protocol).

In the case of the above invention, the positional information of the vehicle includes information about any of XYZ coordinates of road surface absolute position coordinates of the vehicle, XYZ coordinates of road surface absolute position coordinates of tires, Euler angles of own vehicle and a wheel rotation angle.

In the case of the above invention, it is preferred that the image generation unit is provided with a unit of synthesizing a three-dimensional profile of the vehicle by computer graphics.

In the case of the above invention, it is preferred that, as the above vehicle, a plurality of vehicles are set up for each of which the recognition function operates, that the positional information calculation unit changes/modifies the positional information of each of the plurality of vehicles by the use of information about the recognition result of the recognition unit, and that the synchronization control unit controls synchronization among the positional information acquisition unit, the image generation unit, the image recognition unit and the positional information calculation unit for each of the plurality of vehicles.

In the case of the above invention, it is preferred that the image recognition unit is a deep learning recognition unit comprising a multi-stage neural network.

In the case of the above invention, it is preferred that the image recognition unit further comprises: a segmentation unit which performs area division of specific objects to be recognized in the simulation image; and a teacher data creation unit which create teacher data for learning on the basis of the images corresponding to the areas divided by the segmentation unit.

In the case where the sensors include at least one LiDAR sensor, teacher data is set up with a plurality of reflectance values as detection items for each object such as a person, a vehicle, a traffic signal or a road obstacle.

In the case of the above invention, it is preferred that the image generation unit is provided with a unit of generating a different image for each sensor unit.

there is provided, as the sensor unit, with any or all of an image sensor, a LiDAR sensor, a millimeter wave sensor and an infrared sensor.

In the case of the above invention, it is preferred that the image generation unit generates 3D graphics images corresponding to a plurality of sensors respectively, that the image recognition unit receives the 3D graphics images to perform deep learning recognition, and outputs a deep learning recognition result for each sensor, and that the synchronization control unit performs synchronization control on the basis of a deep learning recognition result of each sensor.

In the case of the above invention, it is preferred that in the case where the sensors include at least one LiDAR sensor, the image recognition unit uses, as detection subjects, a plurality of reflectance values as detection items for each object such as a person, a vehicle, a traffic signal or a road obstacle.

As has been discussed above, in accordance with the above inventions, it is possible for learning of a recognition function module such as deep learning (machine learning) to increase the number of samples by artificially generating images such as CG images which are very similar to actually photographed images and improve the recognition rate by increasing learning efficiency. Specifically, in accordance with the present invention, it is possible to artificially and infinitely generate images with a light source, an environment and the like which are do actually not exist by making use of a means for generating and as synthesizing CG images with high reality on the basis of a simulation model. Test can be conducted as to whether or not target objects can be recognized and extracted by inputting the generated images to the recognition function module in the same manner as inputting conventional camera images, and performing the same process with the generated images as with the camera images, and therefore it is possible to perform learning with such types of images as conventionally difficult or impossible to acquire or take, and furthermore to effectively improve the recognition rate by increasing learning efficiency.

Furthermore, synergistic effects can be expected by simultaneously using different types of sensors such as a millimeter wave sensor and a LiDAR sensor capable of extracting a three-dimensional profile of an object in addition to an image sensor capable of acquiring a two-dimensional image and generating images of these sensors to make it possible to conduct extensive tests and perform brush-up of a recognition technique at the same time.

Incidentally, the application of the present invention covers a wide field, such as, for automatic vehicle driving, experimental apparatuses, simulators, software modules and hardware devices related thereto (for example, a vehicle-mounted camera, an image sensor, a laser sensor for measuring a three-dimensional profile of the circumference of a vehicle), and machine learning software such as deep learning. Also, since a synchronization control technique is combined with a CG technique capable of realistically reproducing actually photographed image, the present invention can be widely applied to other fields than the automatic driving of a vehicle. For example, potential fields of application include a simulator of surgical operation, a military simulator and a safety running test system for robot, drone or the like.

DETAILED DESCRIPTION OF THE INVENTION

First Embodiment (Overall Configuration of Vehicle Synchronization Simulator System)

In what follows, with reference to the accompanying drawings, an embodiment of a vehicle synchronization simulator system in accordance with the present invention will be explained in detail. In the case of the present embodiment, an example is described in the case where the simulator system of the present invention is applied to the machine learning and test of an image recognition function module of a vehicle automated driving system. In this description, the automated driving system is a system such as ADAS (advanced driver assistance system) or the like to detect and avoid the possibility of an accident in advance, and performs control to decrease the speed of the vehicle and avoid the objects and the like by recognizing an image (real image) acquired with a sensor means such as a camera or the like actually mounted on a vehicle to detect objects such as other vehicles, walkers and a traffic signal in accordance with an image recognition technique for the purpose of realizing automatic traveling of vehicles.

Figure 1:
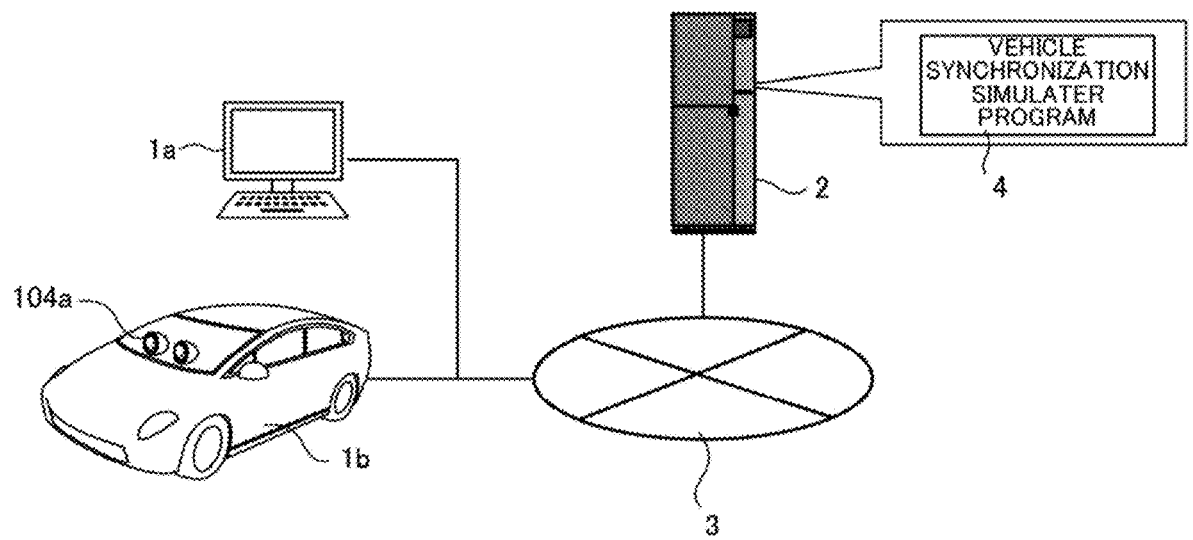
FIG. 1 is a schematic representation showing the overall configuration of the simulator system in accordance with a first embodiment.

FIG. 1 is a schematic representation showing the overall configuration of the simulator system in accordance with the present embodiment. The simulator system in accordance with the present embodiment performs simulation programs with respect to a single or a plurality of simulation objects, and performs the machine learning and test of these simulation programs. As illustrated in FIG. 1, this simulator system includes a simulation server 2 located on a communication network 3, and connected with an information processing terminal 1a and a vehicle-mounted device 1b for generating or acquiring the position of own vehicle through the communication network 3.

The communication network 3 is an IP network using the communication protocol TCP/IP, and a distributed communication network which is constructed by connecting a variety of communication lines (a public network such as a telephone line, an ISDN line, an ADSL line or an optical line, a dedicated communication line, the third generation (3G) communication system such as WCDMA (registered trademark) and CDMA2000, the fourth generation (4G) communication system such as LTE, the fifth generation (5G) or later communication system, and a wireless communication network such as wifi (registered trademark) or Bluetooth (registered trademark)). This IP network includes a LAN such as a home network, an intranet (a network within a company) based on 10BASE-T, 100BASE-TX or the like. Alternatively, in many cases, simulator software is installed in a PC as the above information processing terminal 1a. In this case, simulation can be performed by such a PC alone.

The simulator server 2 is implemented with a single server device or a group of server devices each of which has functions implemented by a server computer or software capable of performing a variety of information processes. This simulator server 2 includes a server computer which executes server application software, or an application server in which is installed middleware for managing and assisting execution of an application on such a computer.

Furthermore, the simulator server 2 includes a Web server which processes a http response request from a client device. The Web server performs data processing and the like, and acts as an intermediary to a database core layer in which a relational database management system (RDBMS) is executed as a backend. The relational database server is a server in which a database management system (DBMS) operates, and has functions to transmit requested data to a client device and an application server (AP server) and rewrite or delete data in response to an operation request.

The information processing terminal 1a and the vehicle-mounted device 1b are client devices connected to the communication network 3, and provided with arithmetic processing units such as CPUs to provide a variety of functions by running a dedicated client program 5. This information processing terminal may be implemented with a general purpose computer such as a personal computer or a dedicated device having necessary functions, and includes a smartphone, a mobile computer, PDA (Personal Digital Assistance), a cellular telephone, a wearable terminal device, or the like.

This information processing terminal 1a or the vehicle-mounted device 1b can access the simulator server 2 through the dedicated client program 5 to transmit and receive data. Part or entirety of this client program 5 is involved in a driving simulation system and a vehicle-mounted automated driving system, and executed to recognize real images such as images captured or detected by a variety of sensors such as a vehicle-mounted camera, or captured scenery images (including CG motion pictures in the case of the present embodiment) and the like by the use of an image recognition technique to detect objects such as other vehicles, walkers and a traffic signal in the images, calculate the positional relationship between own vehicle and the object on the basis of the recognition result, and performs control to decrease the speed of the vehicle and avoid the objects and the like in accordance with the calculation result. Incidentally, the client program 5 of the present embodiment has the simulator server 2 perform an image recognition function, and calculates or acquires the positional information of own vehicle by having the own vehicle virtually travel on a map in accordance with the recognition result of the simulator server 2 or having the own vehicle actually travel on the basis of the automatic driving mechanism of a vehicle positional information calculation unit 51 to change the positional information of the own vehicle.

(Configuration of Each Device)

Figure 2:
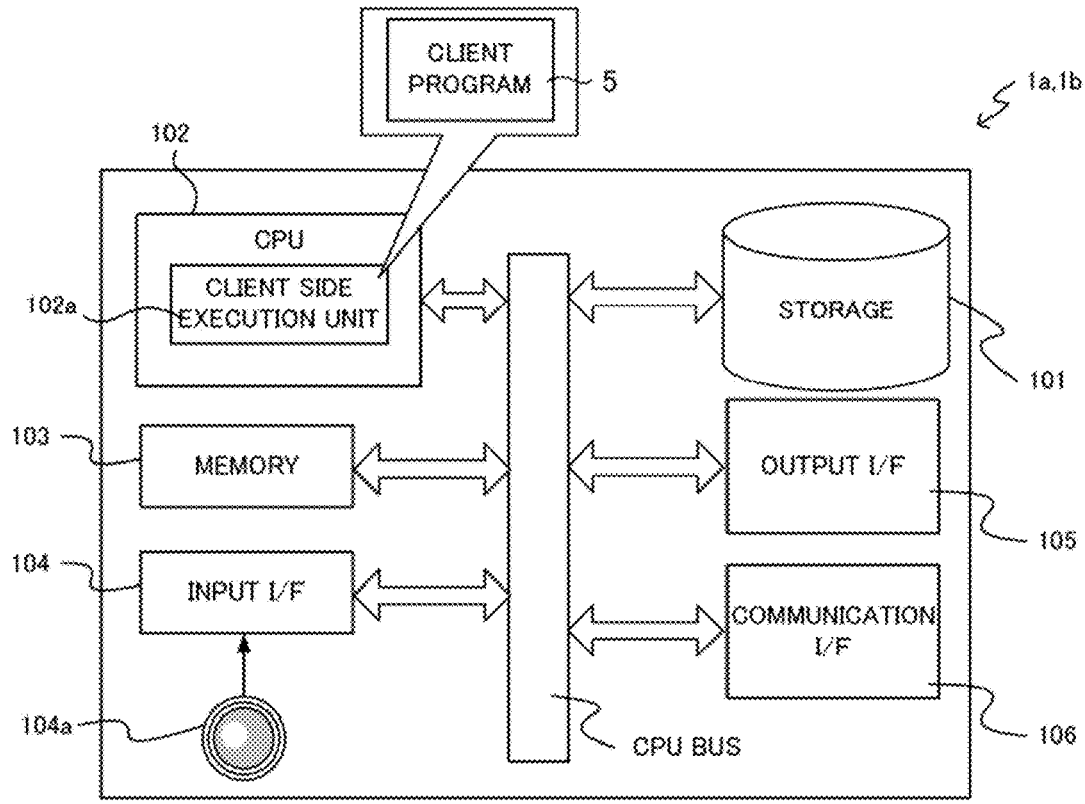
FIG. 2 is a schematic representation showing the configuration of a driving simulator device in accordance with the first embodiment.
Figure 3:
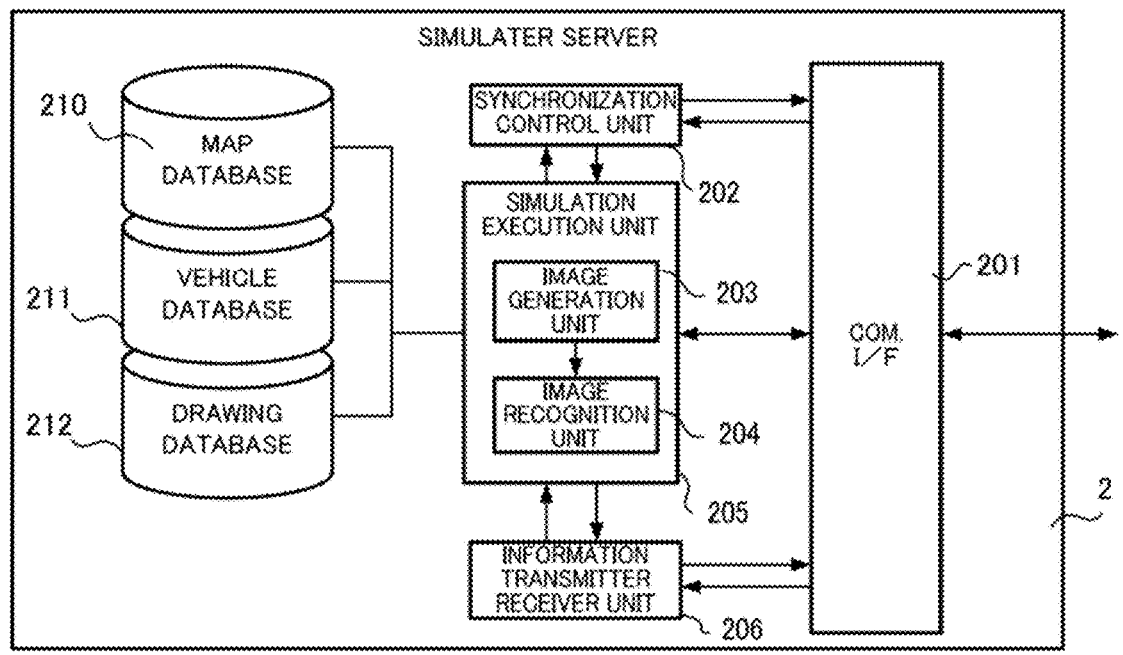
FIG. 3 is a block diagram for showing the structure of a simulator server in accordance with the first embodiment.

Next, the configuration of each device will specifically be explained. FIG. 2 is a block diagram for showing the internal structure of the client device in accordance with the present embodiment. FIG. 3 is a block diagram for showing the internal structure of the simulator server in accordance with the present embodiment. Meanwhile, in the context of this document, the term "module" is intended to encompass any function unit capable of performing necessary operation, as implemented with hardware such as a device or an apparatus, software capable of performing the functionality of the hardware, or any combination thereof.

(1) Configuration of the Client Device

The information processing terminal 1a can be implemented with a general purpose computer such as a personal computer or a dedicated device. On the other hand, the vehicle-mounted device 1b may be a general purpose computer such as a personal computer, or a dedicated device (which can be regarded as a car navigation system) such as an automated driving system. As illustrated in FIG. 2, specifically, the information processing terminal 1a is provided with a CPU 102, a memory 103, an input interface 104, a storage device 101, an output interface 105 and a communication interface 106. Meanwhile, in the case of the present embodiment, these elements are connected to each other through a CPU bus to exchange data thereamong.

The memory 103 and the storage device 101 accumulate data on a recording medium, and read out accumulated data from the recording medium in response to an request from each device. The memory 103 and the storage device 101 may be implemented, for example, by a hard disk drive (HDD), a solid state drive (SSD), a memory card, and the like. The input interface 103 is a module for receiving operation signals from an operation device such as a keyboard, a pointing device, a touch panel or buttons. The received operation signals are transmitted to the CPU 102 so that it is possible to perform operations of an OS or each application. The output interface 105 is a module for transmitting image signals and sound signals to output an image and sound from an output device such as a display or a speaker.

Particularly, in the case where the client device is a vehicle-mounted device 1b, this input interface 104 is connected to a system such as the above ADAS for automatic driving system, and also connected to an image sensor 104a such as a camera or the like mounted on a vehicle, or a various sensor means such as a LiDAR sensor, a millimeter wave sensor, an infrared sensor or the like which acquires real images, for the purpose of realizing the automated driving traveling of a vehicle.

The communication interface 106 is a module for transmitting and receiving data to/from other communication devices on the basis of a communication system including a public network such as a telephone line, an ISDN line, an ADSL line or an optical line, a dedicated communication line, the third generation (3G) communication system such as WCDMA (registered trademark) and CDMA2000, the fourth generation (4G) communication system such as LTE, the fifth (5G) generation or later communication system, and a wireless communication network such as wifi (registered trademark) or Bluetooth (registered trademark)).

The CPU 102 is a device which performs a variety of arithmetic operations required for controlling each element to virtually build a variety of modules on the CPU 102 by running a variety of programs. An OS (Operating System) is executed and run on the CPU 102 to perform management and control of the basic functions of the information processing terminals 1a to 1c. Also, while a variety of applications can be executed on this OS, the basic functions of the information processing terminal are managed and controlled by running the OS program on the CPU 102, and a variety of function modules are virtually built on the CPU 102 by running applications on the CPU 102.

In the case of the present embodiment, a client side execution unit 102a is formed by executing the client program 5 on the CPU 102 to generate or acquire the positional information of own vehicle on a virtual map or a real map, and transmit the positional information to the simulator server 2. The client side execution unit 102a receives the recognition result of scenery images (including CG motion pictures in the case of the present embodiment) obtained by the simulator server 2, calculate the positional relationship between own vehicle and the object on the basis of the received recognition result, and performs control to decrease the speed of the vehicle and avoid the objects and the like on the basis of the calculation result.

(2) Configuration of the Simulator Server

The simulator server 2 in accordance with the present embodiment is a group of server devices which provide a vehicle synchronization simulator service through the communication network 3. The functions of each server device can be implemented by a server computer capable of performing a variety of information processes or software capable of performing the functions. Specifically, as illustrated in FIG. 3, the simulator server 2 is provided with a communication interface 201, a UDP synchronization control unit 202, a simulation execution unit 205, a UDP information transmitter receiver unit 206, and various databases 210 to 213.

The communication interface 201 is a module for transmitting and receiving data to/from other devices through the communication network 3 on the basis of a communication system including a public network such as a telephone line, an ISDN line, an ADSL line or an optical line, a dedicated communication line, the third generation (3G) communication system such as WCDMA (registered trademark) and CDMA2000, the fourth generation (4G) communication system such as LTE, the fifth (5G) generation or later communication system, and a wireless communication network such as wifi (registered trademark) or Bluetooth (registered trademark)).

The UDP synchronization control unit 202 is a module for controlling synchronization between a calculation process to calculate the positional information of own vehicle by varying the position of the own vehicle in the client device 1 side, and an image generation process and an image recognition process in the simulator server 2 side. The vehicle positional information calculation unit 51 of the client device 1 acquires the recognition result of an image recognition unit 204 through the UDP information transmitter receiver unit 206, generates control signals for controlling vehicle behavior by the use of the acquired recognition result, changes/modifies the positional information of own vehicle on the basis of the generated control signals.

The UDP information transmitter receiver unit 206 is a module for transmitting and receiving data to/from the client side execution unit 102a of the client device 1 in cooperation. In the case of the present embodiment, the positional information is calculated or acquired in the client device 1 side, and packetized in a particular format. While the packetized data is transmitted to the simulator server 2 through a network or a transmission bus in a particular device, the packetized data is received and depacketized by the simulator server 2, and the depacketized data is input to an image generation unit 203 to generate images. Meanwhile, in the case of the present embodiment, the UDP information transmitter receiver unit 206 transmits and receives, by the use of UDP (User Datagram Protocol), signals which are transmitted and received among the respective devices with the UDP synchronization control unit 202.

The above various databases include a map database 210, a vehicle database 211 and a drawing database 212. Incidentally, these databases can be referred to each other by a relational database management system (RDBMS).

The simulation execution unit 205 is a module for generating a simulation image reproducing an area specified on the basis of positional information generated or acquired by the positional information acquisition means of the client device 1 and transmitted to the simulator server 2, and recognizing and detecting particular objects in the generated simulation image by the use of the recognition function module. Specifically, the simulation execution unit 205 is provided with the image generation unit 203 and the image recognition unit 204.

The image generation unit 203 is a module for acquiring the positional information acquired or calculated by the positional information acquisition means of client device 1 and generating a simulation image for reproducing, by a computer graphics technique, an area (scenery based on latitude and longitude coordinates of a map, and direction and a view angle) specified on the basis of the positional information. The simulation image generated by this image generation unit 203 is transmitted to the image recognition unit 204.

The image recognition unit 204 is a module for recognizing and detecting particular objects in the simulation image generated by the image generation unit 203 with the recognition function module 204a which is under test or machine learning. The recognition result information D06 of this image recognition unit 204 is transmitted to the vehicle positional information calculation unit 51 of the client device 1. The image recognition unit 204 is provided with a learning unit 204b to perform machine learning of the recognition function module 204a. This recognition function module 204a is a module for acquiring a real image acquired with a sensor means such as a camera device or CG generated by the image generation unit 203, hierarchically extracting a plurality of feature points in the acquired image, and recognizing objects from the hierarchical combination patterns of the extracted feature points. The learning unit 204b promotes diversification of extracted patterns and improves learning efficiency by inputting images captured by the above camera device or virtual CG images to extract feature points of images which are difficult to image and reproduce in practice.

(Method of the Vehicle Synchronization Simulator System)

Figure 4A:
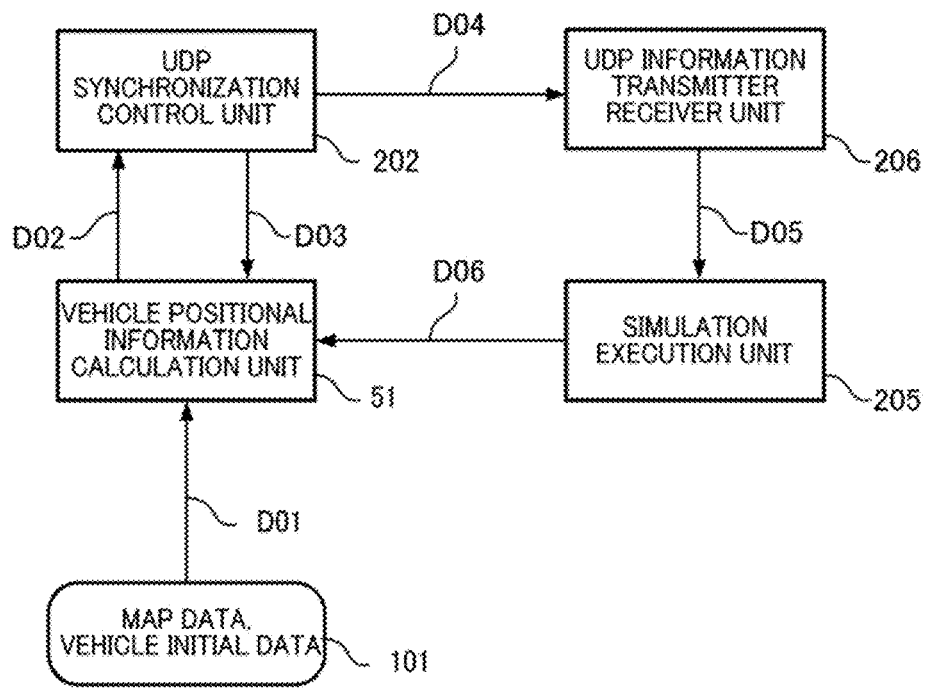
FIGS. 4A and 4B are block diagrams for showing the configuration and operation of image generation and image recognition in accordance with the first embodiment.
Figure 4B:
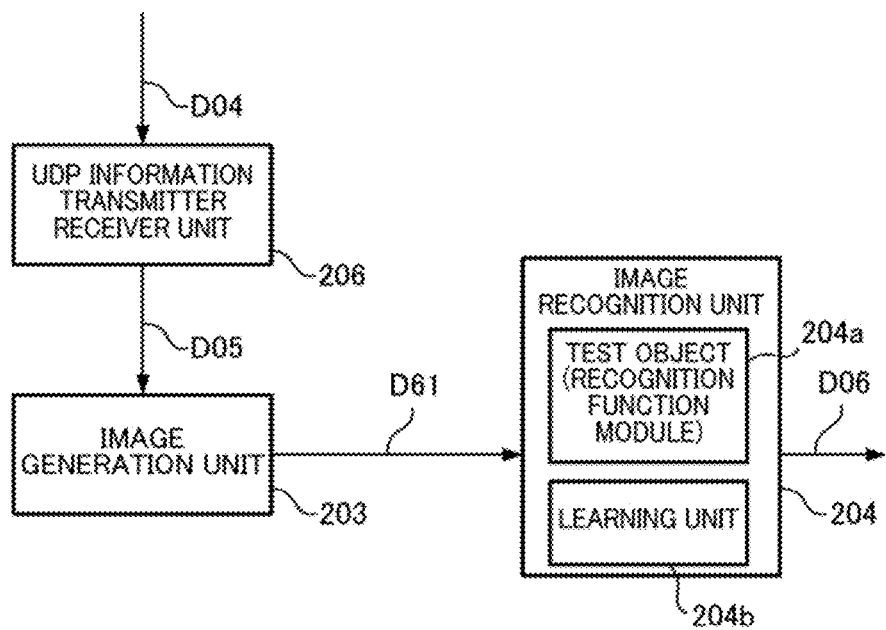
Figure 5:
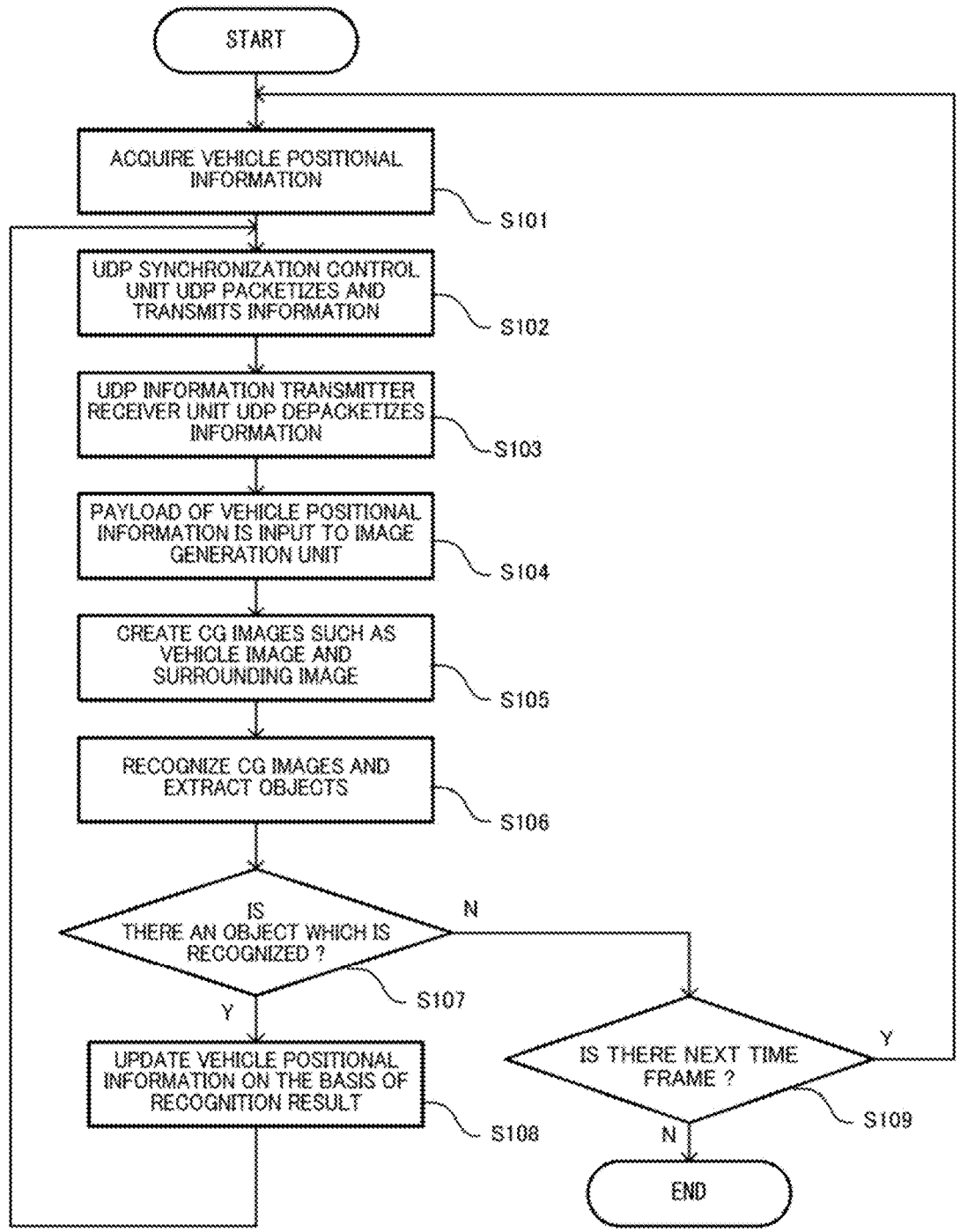
FIG. 5 is a flow chart for showing the procedure of a system in accordance with the first embodiment.

The vehicle synchronization simulation method can be implemented by operating the vehicle synchronization simulator system having the structure as described above. FIGS. 4A and 4B are block diagrams for showing the configuration and operation of image generation and image recognition in accordance with the present embodiment. FIG. 5 is a flow chart for showing the procedure of a synchronization simulator in accordance with the present embodiment.

At first, the vehicle positional information calculation unit 51 acquires vehicle positional information D02 of own vehicle (S101). Specifically, the client program 5 is executed in the client device 1 side to input a various data group D01 such as map information and vehicle initial data to the vehicle positional information calculation unit 51. Next, the positional information of own vehicle on a virtual map or an actual map is calculated (generated) or acquired by the use of the data group D01. The result is transmitted to the simulation execution unit 205 of the simulator server 2 (S102) as vehicle positional information D02 through the UDP synchronization control unit 202 or the UDP information transmitter receiver unit 206.

Specifically speaking, the vehicle positional information calculation unit 51 transmits the vehicle positional information D02 of own vehicle to the UDP synchronization control unit 202 in accordance with the timing of a control signal D03 from the UDP synchronization control unit 202. Of initial data of the vehicle positional information calculation unit 51, map data, the positional information of own vehicle in the map, the rotation angle and diameter of a wheel of the vehicle body frame and the like information, can be loaded from the predetermined storage device 101. The UDP synchronization control unit 202 and the UDP information transmitter receiver unit 206 transmit and receive data from/to the client side execution unit 102a of the client device 1 in cooperation. Specifically, the UDP synchronization control unit 202 and the UDP information transmitter receiver unit 206 transmit the vehicle positional information D02 calculated or acquired in the client device 1 side to the simulator server 2 as packet information D04 packetized in a particular format with a various data group including vehicle information.

While this packetized data is transmitted through a network or a transmission bus in a particular device, the packetized data is received and depacketized by the simulator server 2 (S103), and the depacketized data D05 is input to the image generation unit 203 of the simulation execution unit 205 to generate CG images. In this case, the UDP information transmitter receiver unit 206 transmits and receives the packetized packet information D04 of a various data group including vehicle information among the respective devices by the UDP synchronization control unit 202 according to UDP (User Datagram Protocol).

Specifically describing, the UDP synchronization control unit 202 converts the various data group into the packetized packet information D04 by UDP packetizing the vehicle positional information D02 of own vehicle. Thereby, data transmission and reception by the use of the UDP protocol becomes easy. At this time, UDP (User Datagram Protocol) will be described to some extent. Generally speaking, while TCP is high reliable and connection oriented and performs windowing control, retransmission control and congestion control, UDP is a connection-less protocol which has no mechanism to secure reliability but has a substantial advantage due to low delay because the process is simple. In the case of the present embodiment, since low delay is required during transmitting data among the constituent elements, UDP is employed instead of TCP. Alternatively, RTP (Real-time Transport Protocol) may be used as the most common protocol for voice communication and video communication at the present time.

Next, the vehicle positional information D02 of own vehicle specifically contains, for example, the following information.

Positional information (three dimensional coordinates (X, Y, Z) of road surface absolute position coordinates) of own vehicle Euler angles of own vehicle Positional information (three dimensional coordinates (X, Y, Z) of road surface absolute position coordinates or the like) of tires Wheel rotation angle Stamping margin of a brake and a steering wheel Receiving the vehicle positional information D02, the UDP information transmitter receiver unit 206 transmits data D05 necessary mainly for generating a vehicle CG image, from among information about the vehicle, e.g., XYZ coordinates as the positional information of the vehicle, XYZ coordinates as the positional information of tires, Euler angles and other various information.

Then, the packet information D04 as UDP packets of the various data group is divided into a packet header and a payload of a data body by a depacketizing process in the UDP information transmitter receiver unit 206. In this case, the UDP packet data can be exchanged by transmission between places remote from each other through a network or transmission inside a single apparatus such as a simulator through a transmission bus. The data D05 corresponding to a payload is input to the image generation unit 203 of the simulation execution unit 205 (S104).

In the simulation execution unit 205, the image generation unit 203 acquires positional information acquired or calculated by the positional information acquisition means of the client device 1 as the data D05, and generates a simulation image for reproducing, by a computer graphics technique, an area (scenery based on latitude and longitude coordinates of a map, a direction and a view angle) specified on the basis of the positional information (S105). The 3D graphics composite image generated by this image generation unit 203 is transmitted to the image recognition unit 204.

The image generation unit 203 generates a realistic image by a predetermined image generation method, for example, a CG image generation technique which makes use of the latest physically based rendering (PBR) technique. The recognition result information D06 is input to the vehicle positional information calculation unit 51 again and used, e.g., for calculating the positional information of own vehicle for determining the next behavior of the own vehicle.

The image generation unit 203 generates objects such as a road surface, buildings, a traffic signal, other vehicles and walkers by, for example, a CG technique making use of the PBR technique. This can be understood as feasible with the latest CG technique from the fact that objects such as described above are reproduced in a highly realistic manner in a title of a game machine such as PlayStation. In many cases, object images other than own vehicle are stored already as initial data. Particularly, in an automatic driving simulator, a large amount of sample data such as a number of highways and general roads is stored in a database which can readily be used.

Next, the image recognition unit 204 recognizes and extracts particular targets, as objects, by the use of the recognition function module 204*a* which is under test or machine learning from simulation images generated by the image generation unit 203 (S106). In this case, if there is no object which is recognized ("N" in step S107), the process proceeds to the next time frame (S109), and the above processes S101 to S107 are repeated ("Y" in step S109) until all the time frames are processed ("N" in step S109).

On the other hand, if there is an object which is recognized ("Y" in step S107), the recognition result of this image recognition unit 204 is transmitted to the vehicle positional information calculation unit 51 of the client device 1 as the recognition result information D06. The vehicle positional information calculation unit 51 of the client device 1 acquires the recognition result information D06 of the image recognition unit 204 through the UDP information transmitter receiver unit 206, generates control signals for controlling vehicle behavior by the use of the acquired recognition result, changes/modifies the positional information of own vehicle on the basis of the generated control signals (S108).

Specifically describing, the CG image generated here as the simulation image D61 is input to the image recognition unit 204 in place of an real image usually acquired by sensor means and, as already described above, objects are recognized and detected by, for example, a recognition technique such as deep learning. The recognition results as obtained are given as area information in a screen (for example, two-dimensional XY coordinates of an extracted rectangular area) such as other vehicles, walkers, road markings and a traffic signal.

When running a simulator for automatic driving, there are a number of objects such as other vehicles, walkers, buildings and a road surface in a screen in which an actual vehicle is moving. Automatic driving is realized, for example, by automatically turning the steering wheel, stepping on the accelerator, applying the brake and so on while obtaining realtime information obtained from a camera mounted on the vehicle, a millimeter wave sensor, a radar and other sensors.

Figure 6:
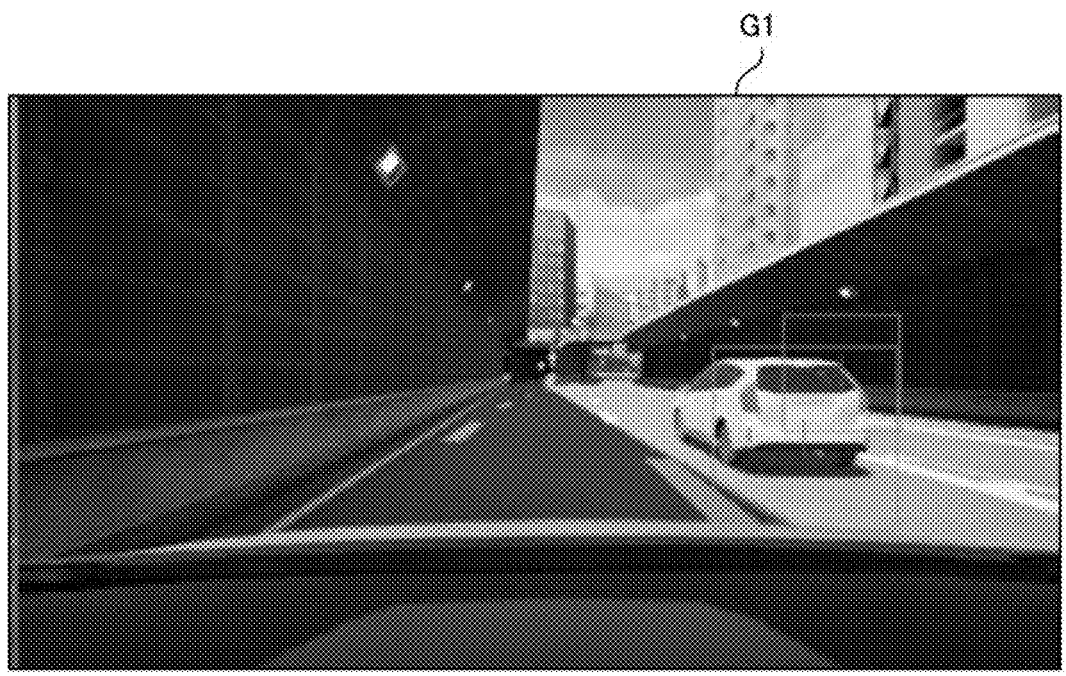
FIG. 6 is an explanatory view for showing the recognition result of another vehicle from a CG image of the system in accordance with the first embodiment.
Figure 7:
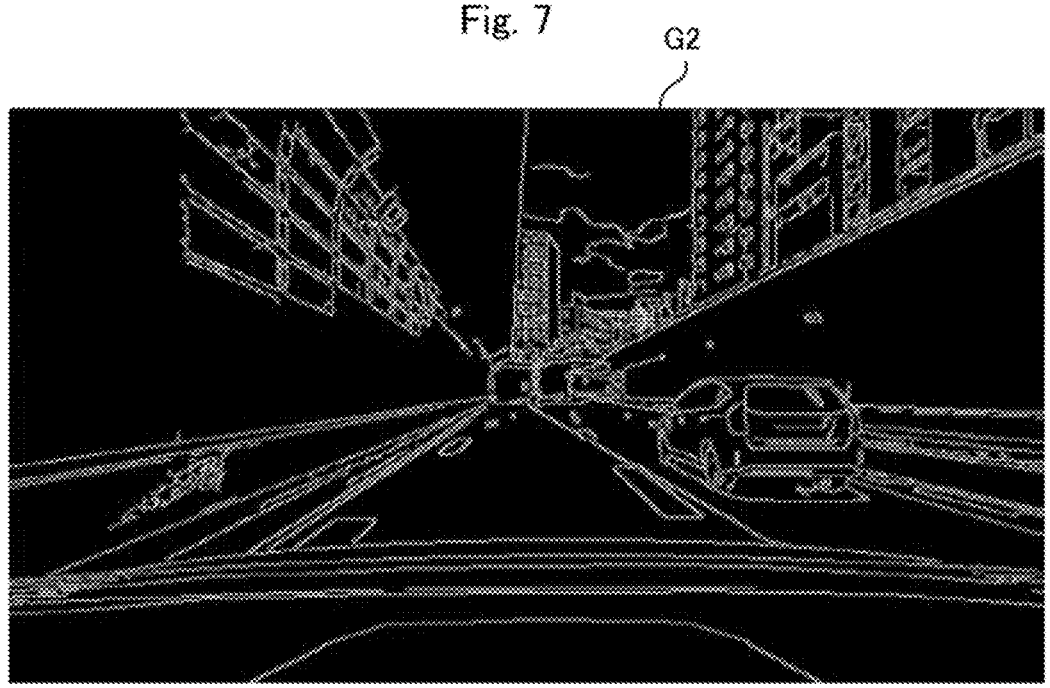
FIG. 7 is an explanatory view for showing the recognition result of another vehicle from a CG image of the system in accordance with the first embodiment.
Figure 8:
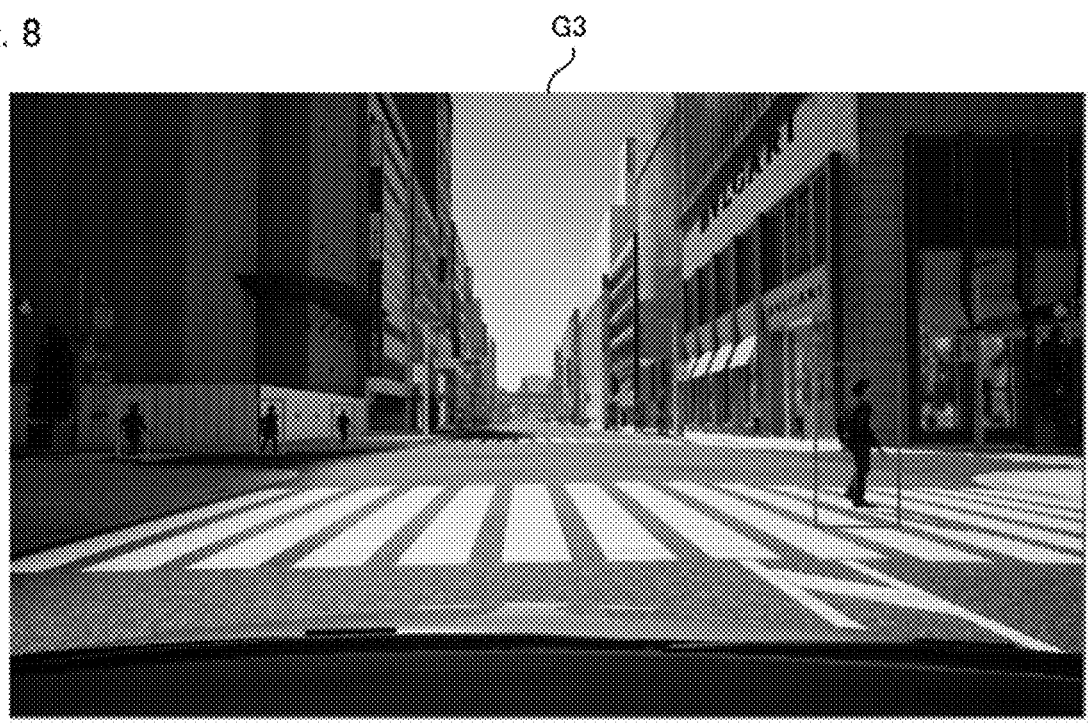
FIG. 8 is an explanatory view for showing the recognition result of a walker from a C G image of the system in accordance with the first embodiment.

Accordingly, in the case of a camera image, a recognition technique such as deep learning is used to recognize and discriminate objects necessary for automatic driving such as other vehicles, walkers, road markings and a traffic signal from among objects displayed on a screen. FIG. 6 and FIG. 7 show an example in which another moving vehicle is recognized and extracted from a CG image G1 of a highway (image G2 of FIG. 7 is a black-and-white binary image obtained by binarizing the original image and used for extracting white lines on a road surface. On the other hand, the upper figure shows a recognition result as a vehicle of an image area similar to the profile of a vehicle). On the other hand, FIG. 8 shows an example in which a deep learning technique is used to recognize and detect walkers from a CG image G3. Image areas surrounded by rectangles indicate walkers and can accurately be detected from places near own vehicle and also from places far from the own vehicle.

For example, when another vehicle cuts in front of own vehicle in FIG. 6 and FIG. 7, the image recognition unit 204 detects the approach by an image recognition technique, and outputs the recognition result information D06 of the recognition result to the vehicle positional information calculation unit 51. The vehicle positional information calculation unit 51 changes the positional information of own vehicle by turning the steering wheel to avoid the another vehicle, applying the brake to decelerate own vehicle or performing the like operation. In an another case where a walker of FIG. 8 suddenly runs out in front of own vehicle, likewise, the vehicle positional information calculation unit 51 changes the positional information of own vehicle by turning the steering wheel to avoid this walker, applying the brake to decelerate own vehicle or performing the like operation.

Meanwhile, in the above described configuration, it is assumed that data is transmitted in a cycle of 25 msec (25 msec is only one example) according to the UDP protocol from the vehicle positional information calculation unit 51 to the simulation execution unit 205 through the UDP synchronization control unit 202 and the UDP information transmitter receiver unit 206.

Incidentally, the need of "synchronizing model" which is a characteristic feature of the present invention exists because the vehicle positional information of the next time frame is determined on the basis of the output result from the simulation execution unit 205 so that the behavior of a real vehicle cannot be simulated unless the entirety can be synchronously controlled. In the above example, transmission is performed in a cycle of 25 msec. However, ideal delay is zero which is practically impossible, so that UDP is employed to reduce the delay time associated with transmission and reception.

Generally speaking, in the case of an automatic driving simulator, test has to be conducted with a very large amount of motion image frames. It is an object of the present embodiment to substitute CG images nearer to actual photographs for an unquestioning amount which cannot be covered by real driving. Accordingly, it is necessary to guarantee operations in response to a long sequence of video sample data.

In the case of the present embodiment, the learning unit 204*b* diversifies extracted pattern to improve learning efficiency by inputting, in addition to images taken by a vehicle mounted camera during real driving, virtual CG images generated by the image generation unit 203 to the recognition function module 204*a* to extract the feature points of images which are difficult to take and reproduce. The recognition function module 204*a* acquires images taken by the camera device and CG images, hierarchically extracts a plurality of feature points in the acquired images, and recognizes objects on the basis of combinational hierarchic patterns of the extracted objects.

Figure 9:
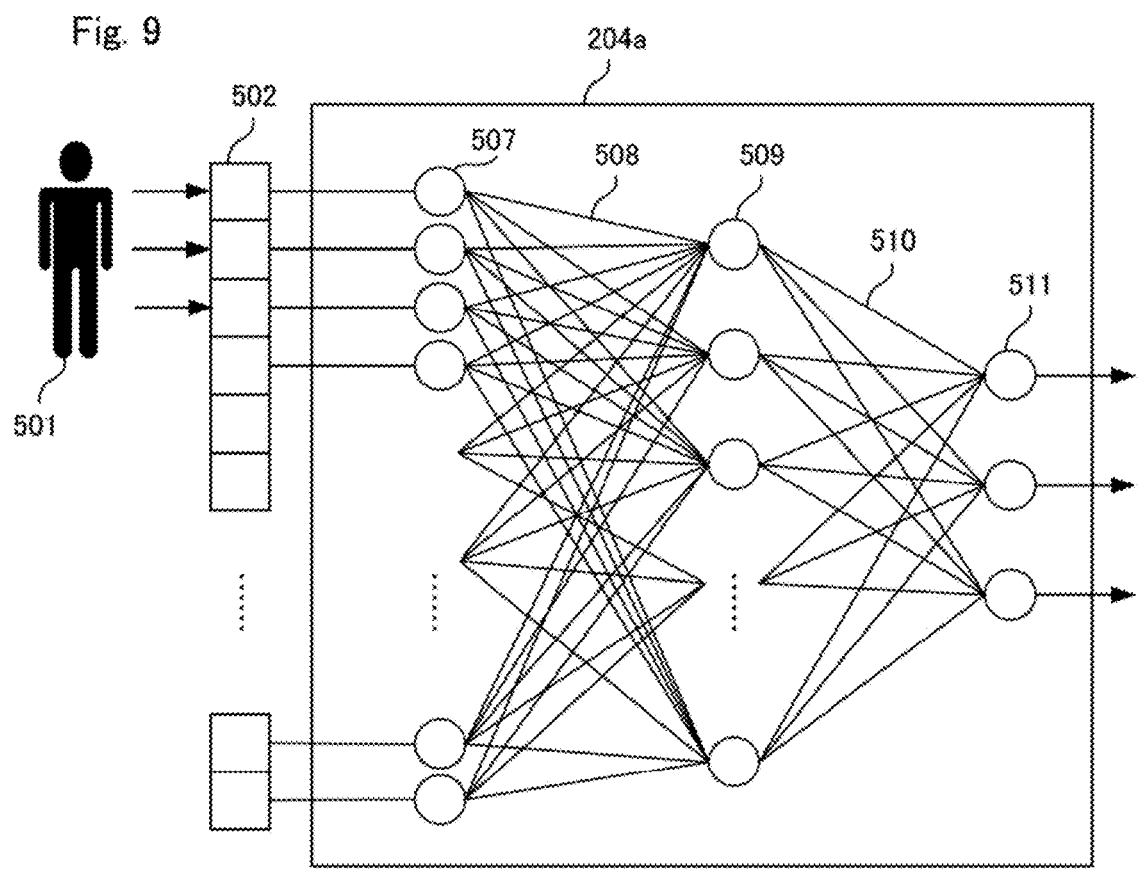
FIG. 9 is an explanatory view for showing the general outline of the recognition process of a recognition function module in accordance with the embodiment.

FIG. 9 shows the general outline of the recognition process of this recognition function module 204*a*. As shown in the same figure, the recognition function module 204*a* is a multi-class discrimination unit which sets up a plurality of objects and detects an object 501 ("person" in this case) including particular feature points from among the plurality of objects. This recognition function module 204*a* includes input units (input layer) 507, first weighting factors 508, hidden units (hidden layer) 509, second weighting factors 510 and output units (output layer) 511.

A plurality of feature vectors 502 is input to the input units 507. The first weighting factors 508 weight the outputs from the input units 507. The hidden unit 509 nonlinearly converts the linear combination of the outputs from the input units 507 and the first weighting factors 508. The second weighting factors 510 weight the outputs from the hidden units 509. The output units 511 calculate the discrimination probability of each class (for example, vehicle, walker and motorcycle). In this case, while the number of the output units 511 is three, the present invention is not limited thereto. The number of the output units 511 equals to the number of objects which can be discriminated by the discrimination unit. By increasing the number of the output units 511, the number of objects which can be discriminated by the discrimination unit can be increased such as two-wheeled vehicle, markings and baby buggy in addition to vehicle, walker and motorcycle.

The recognition function module 204a in accordance with the present embodiment is an example of a multi-stage (three-stage in this case) neural network, and the discrimination unit learns the first weighting factors 508 and the second weighting factors 510 by an error backward propagation method. Also, the recognition function module 204a of the present invention is not limited to a neural network, but may be applied to a multi-layer perceptron and a deep neural network having a plurality of hidden layers. In this case, the discrimination unit learns the first weighting factors 508 and the second weighting factors 510 by deep learning. Also, since the discrimination unit installed in the recognition function module 204a is a multi-class discrimination unit, for example, it is possible to detect a plurality of objects such as vehicle, walker and motorcycle.

(Outline of Teacher Data Provision Function)

Figure 10:
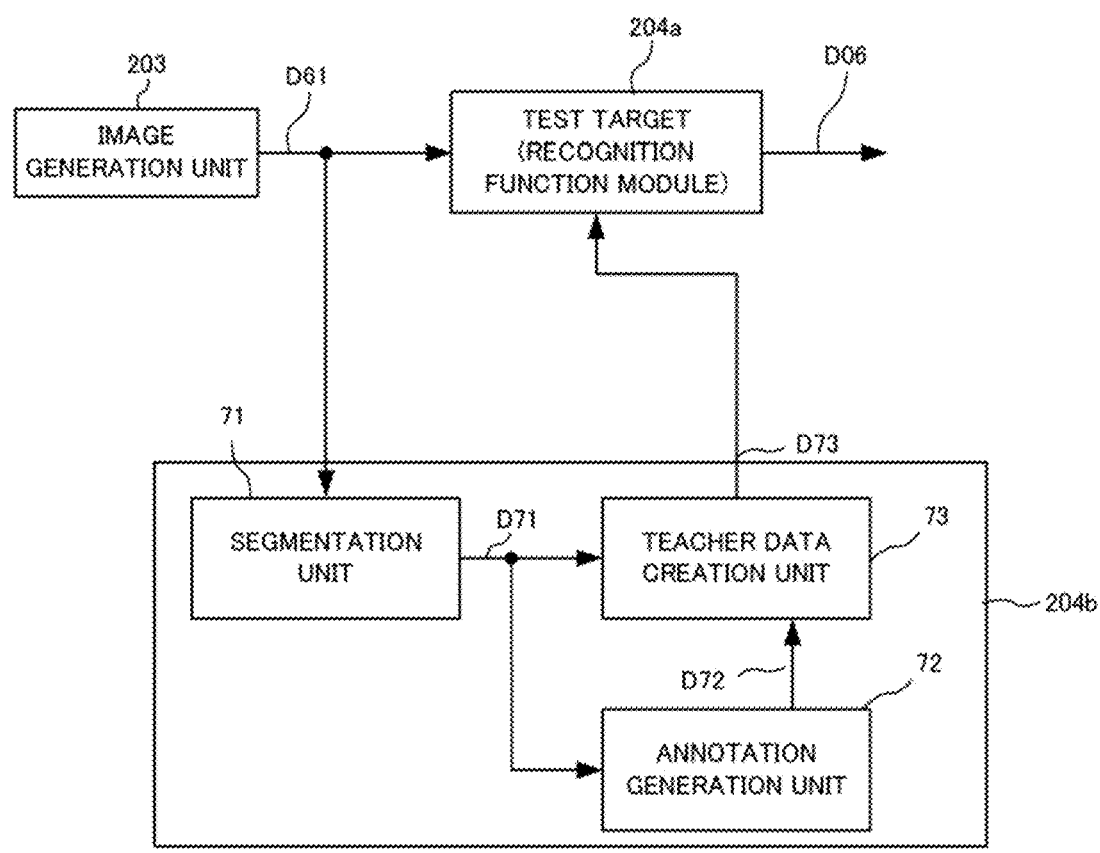
FIG. 10 is a view for explaining a segmentation map of an image.

Furthermore, the recognition function module 204a serves as a deep learning recognition unit connected to the learning unit 204b which is provided with a teacher data creation means for providing teacher learning data D73 as teacher data for learning as illustrated in FIG. 10. Specifically, the teacher data provision function of the learning unit 204b is implemented with a segmentation unit 71, an annotation generation unit 72 and a teacher data creation unit 73.

The segmentation unit 71 is a module for performing area division (segmentation) of specific objects to be recognized in an image to perform deep learning recognition. Specifically, for performing deep learning recognition, it is necessary in general to perform area division of specific objects in an image corresponding to, besides an opposing vehicle, walkers, a traffic signal, guard rail, bicycles, roadside trees and the like which are recognized with a high degree of accuracy and at a high speed to realize safe automatic driving.

Figure 11:
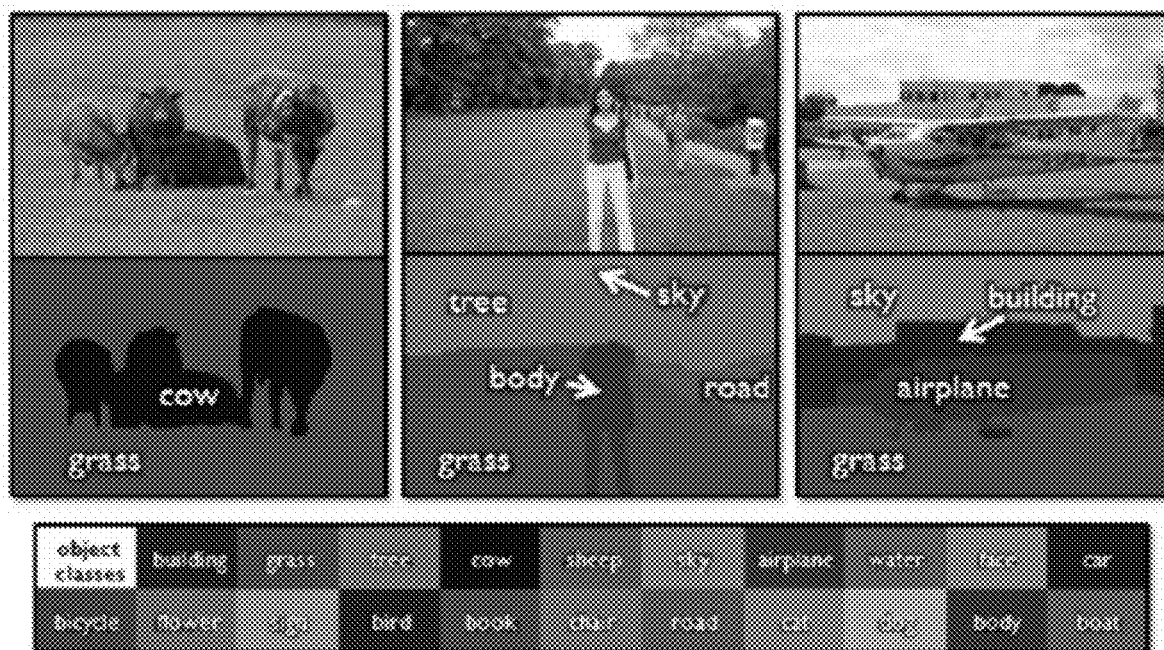
FIG. 11 is a view for explaining a segmentation map in which a plurality of objects on a road are discriminated by colors respectively.
Figure 12:
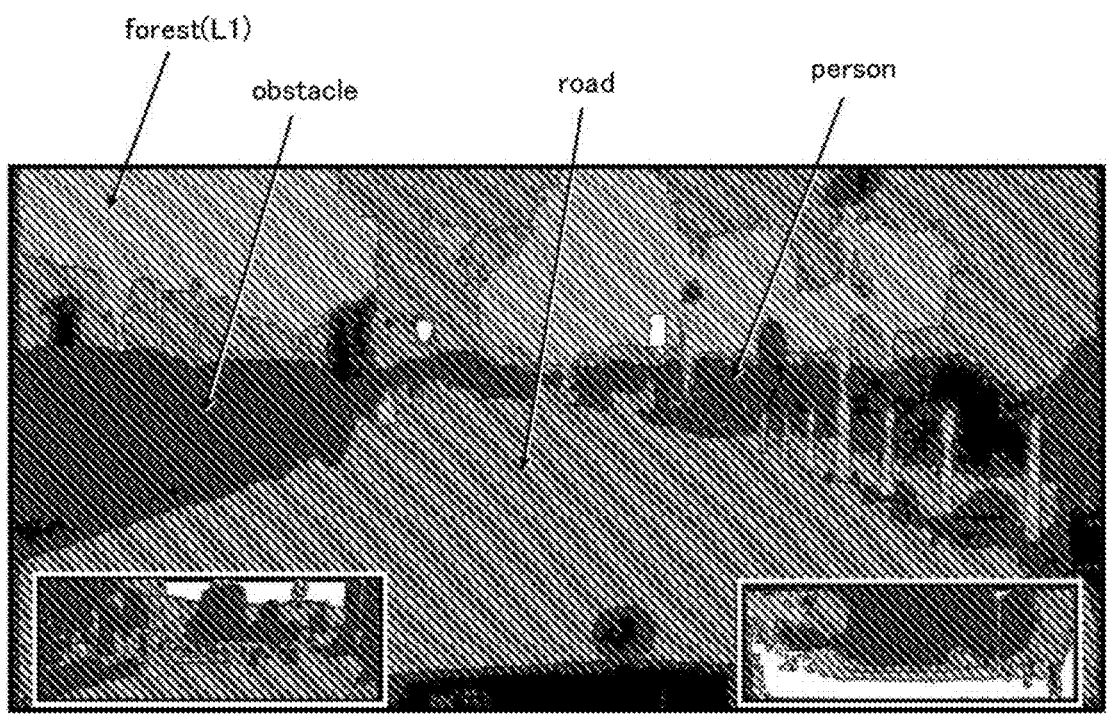
FIG. 12 is a view for explaining a result in which a vehicle and a person are correctly recognized after deep learning recognition is performed with a CG image.

The segmentation unit 71 performs segmentation of a variety of images such as the simulation image D61 which is a 3D graphics composite image generated by the image generation unit 203 and an actual photographed image D60 from an existing real image input system. As illustrated in FIG. 11, the segmentation unit 71 generates segmentation images D71 as a segmentation map in which a variety of subject images are discriminated by colors respectively. The segmentation map is provided with color information for assigning a color to each object (target) as illustrated in the lower part of FIG. 11. For example, grass is green, airplane is red, building is orange, cow is blue, person is ocher, and so on. Also, FIG. 12 shows an example of a segmentation map on a road in which are displayed an actual photographed image in the bottom left corner, an image taken by a sensor in the bottom right corner, and segmented area images in the intermediate area in which are displayed objects such as a road in purple, forest in green, obstacles in blue, persons in red and so forth.

The annotation generation unit 72 is a module for performing annotation which associates each area image with a particular object. This annotation is to furnish relevant information (meta data) as commentary notes for a particular object associated with each area image, i.e., describe text by tagging the meta data in a description language such as XML, to separate various information into "meaning of information" and "content of information". The XML furnished by this annotation generation unit 72 is described by associating each object ("content of information" as described above) which is segmented with its information ("meaning of information" as described above, for example, person, vehicle or traffic signal corresponding to each area image).

Figure 13:
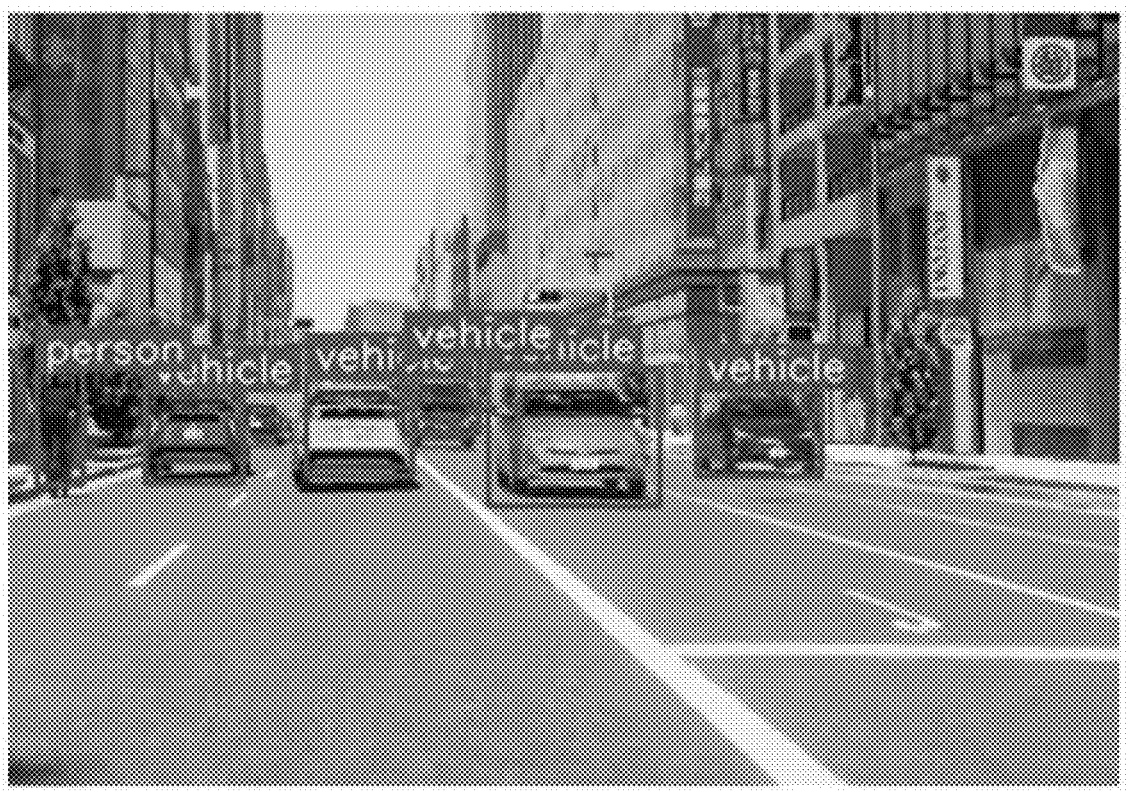
FIG. 13 is a view (XML description) for explaining an example of annotation description in a segmentation map for performing learning of deep learning recognition.

FIG. 13 shows an image of a certain road reproduced by CG from which are identified and extracted in square, as a result of a deep learning recognition technique, vehicle area images (vehicle), person area images (person) which are furnished with annotations. A square can be defined by the XY coordinates of the upper left point and the XY coordinates of the lower right point.

The annotation shown in FIG. 13 as an example can be described in an XML, for example, as <all_vehicles>-</all_vehicles> in which is described information about all the vehicles in the image. The first road Vehicle-1 is defined as a square area by upper left coordinates of (100, 120) and lower right coordinates of (150, 150). In a like manner, information about all the persons is described in <all_persons>-</all_persons>, and the first road Persons-1 is defined as a square area by upper left coordinates of (200, 150) and lower right coordinates of (220, 170).

Accordingly, in the case where there are a plurality of vehicles in the image, the above description is continued from Vehicle-2 in sequence. Likewise, other objects can be described with tag information, for example, "bicycle" for bicycle, "signal" for traffic signal and "tree" for tree.

The 3D graphics composite image as the simulation image D61 generated by the image generation unit 203 is input to the segmentation unit 71 and divided by the segmentation unit 71 into areas which are distinguished by color, for example, as illustrated in FIG. 11.

Thereafter, the segmentation images D71 (after distinguished by color) are input to the annotation generation unit 72 which outputs annotation information D72 for example described in an XML, description language to the teacher data creation unit 73. The teacher data creation unit 73 attaches tags to the segmentation images D71 and the annotation information D72 to create teacher data for deep learning recognition. The tagged teacher learning data D73 becomes the final output result.

Second Embodiment

Figure 14:
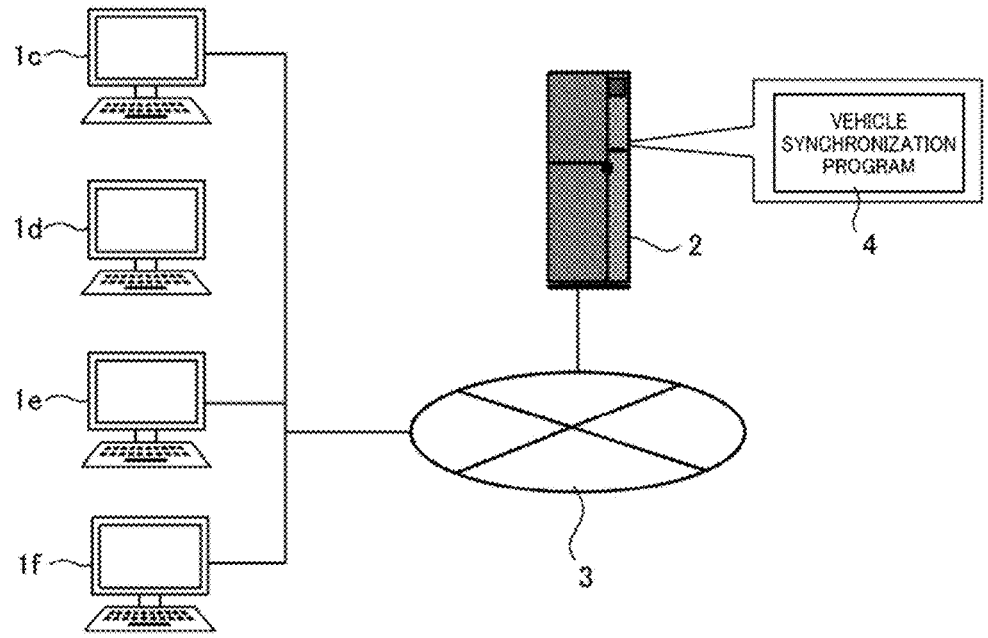
FIG. 14 is a view for explaining vehicle synchronization simulation performed with a plurality of terminals in accordance with a second embodiment.
Figure 15:
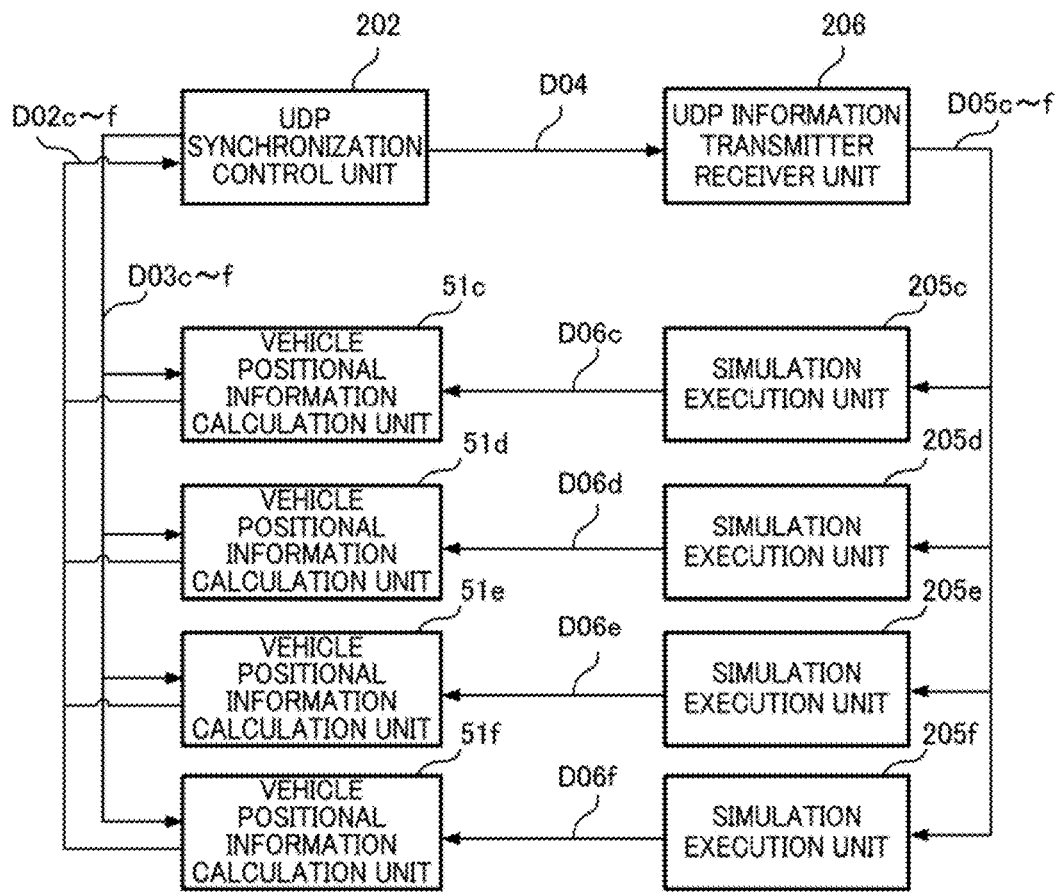
FIG. 15 is a view for showing an actual configuration corresponding to FIG. 14.

In what follows, with reference to the accompanying drawings, a second embodiment of the system in accordance with the present invention will be explained in detail. FIG. 14 is a schematic representation showing is a view for showing the overall configuration of the system in accordance with the present embodiment. FIG. 15 is a block diagram for showing the internal structure of the device in accordance with the present embodiment. The first embodiment as described above is an embodiment in which own vehicle is limited to a single vehicle. The second embodiment is directed to an example in which the positional information of number of vehicles are simultaneously processed in parallel. Meanwhile, in the description of the present embodiment, like reference numbers indicate functionally similar elements as the above first embodiment unless otherwise specified, and therefore no redundant description is repeated.

As shown in FIG. 14, in the case of the present embodiment, a plurality of client devices 1c to 1f are connected to the simulator server 2, and as shown in FIG. 15, while the UDP synchronization control unit 202 and the UDP information transmitter receiver unit 206 serve as common elements in the simulator server 2, in correspondence with the number of vehicles to be simulated, there are vehicle positional information calculation units 51c to 51f provided in the client devices 1c to 1f respectively and simulation execution units 205c to 205f provided in the simulator server 2.

The vehicle positional information calculation units 51c to 51f transmit vehicle positional information D02c to D02f to the UDP synchronization control unit 202 with the timing of control signals D03c to D03f. Next, the UDP synchronization control unit 202 converts the vehicle positional information D02c to D02f to packet information D04 by UDP packetization. Thereby, data transmission and reception by the use of the UDP protocol becomes easy. The packet information D04 is divided into a packet header and a payload of a data body by a depacketizing process in the UDP information transmitter receiver unit 206. In this case, the UDP packet data can be exchanged by transmission between places remote from each other through a network or transmission inside a single apparatus such as a simulator through a transmission bus. The data D05c to D05f corresponding to a payload is input to the simulation execution units 205c to 205f.

As has already been discussed above in the first embodiment, the simulation execution units 205c to 205f generates a realistic image by a predetermined image generation method, for example, a CG image generation technique which makes use of the latest physically based rendering (PBR) technique. The recognition result information D06c to D06f is fed back to the vehicle positional information calculation units 51c to 51f to change the position of each vehicle.

Incidentally, while there are four vehicle positional information calculation units 51c to 51f in the above example, this number is not limited to four. However, if the number of vehicles to be supported increases, synchronization control as a result becomes complicated, and there is a problem that when there occurs a substantial delay in a certain vehicle, the total delay time increases since the delay times of the vehicles are summed up. Accordingly, the configuration can be designed in accordance with the hardware scale, processing amount and other conditions of the simulator server.

Incidentally, while PC terminals 1c to 1f are remotely connected to a vehicle synchronization simulator program 4 through the communication network 3 in FIG. 14, the PC terminals 1c to 1f can be operated in a stand-alone manner by installing a program in a local recording medium such as an HDD or an SDD. In this case, there are advantages in that test can be performed with a low delay and that no influence of congestion troubles or the like need not be considered when a shortage of network band is caused.

Furthermore, while 1c to 1f are not limited to PC terminals, for example, when test is conducted with actually moving vehicles, 1c to 1f can be considered to refer to car navigation systems mounted on the test vehicles. In this case, rather than recognizing the 3D graphics composite image as the simulation image D61 generated by the image generation unit 203 of FIG. 4B, the learning unit 204 receives a live-action video in place of the simulation image D61 so that the system can be used for evaluating the performance of the image recognition unit 204. This is because, while a human being can immediately and accurately recognize a walker and a vehicle in a live-action video, it is possible to verify whether or not the image recognition unit 204 can output the same result of extraction and recognition.

MODIFICATION EXAMPLES

Incidentally, the above explanation of the embodiment shows one example of the present invention. The present invention is therefore not limited to the embodiment of the present invention as described above, and various modifications and variations are possible in accordance with the design and so forth without departing from the spirit of the invention.

Modification Example 1

Figure 16:
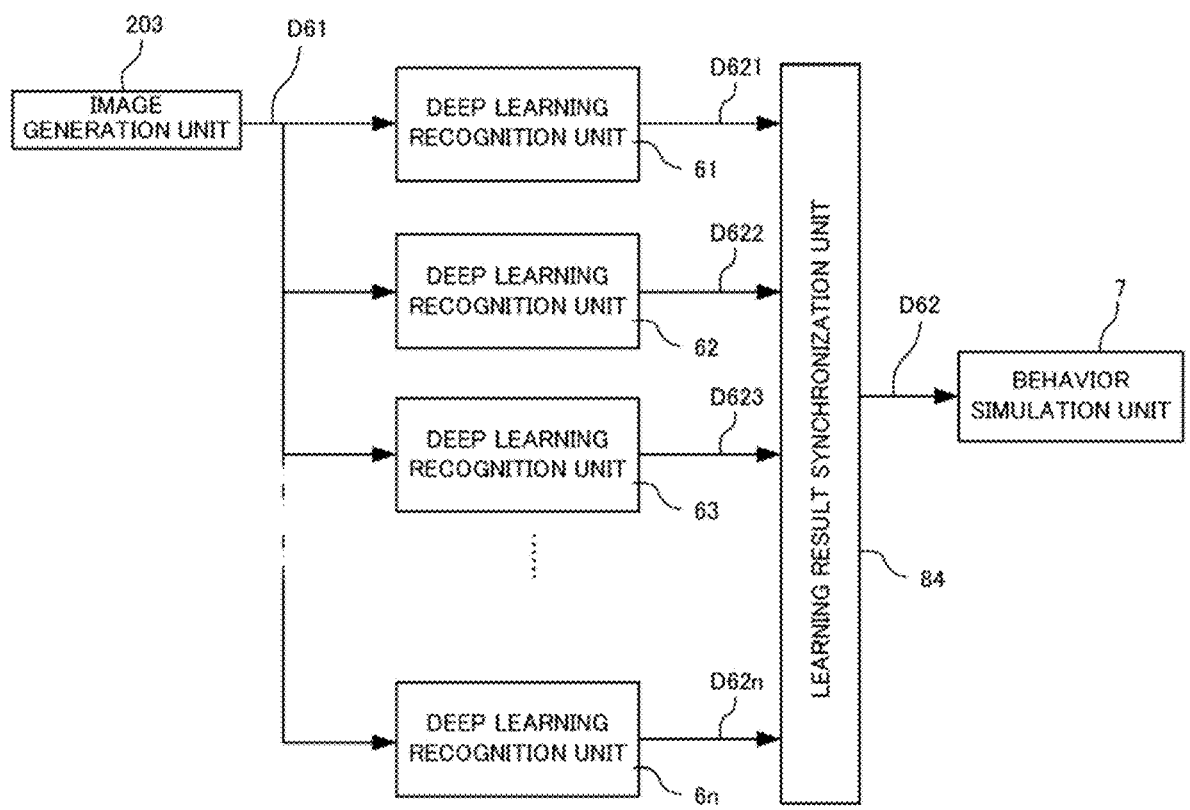
FIG. 16 is a view for explaining deep learning recognition and behavior simulation per formed by generating CG images with a plurality of sensors in the case of a modification example 1.

While the vehicle mounted camera 104a is a single camera in the examples of the above embodiments, for example, a plurality of cameras or sensors can be used instead as illustrated in FIG. 16.

A plurality of sensors have to be installed for the purpose of improving safety for automatic driving. Accordingly, the recognition rate of an object in an image can be improved by creating 3D graphics composite images from images taken by the use of a plurality of sensors, as in this modification example, and recognizing the composite images with deep learning recognition units 61 to 6n.

In addition, while a plurality of sensors are installed in a single vehicle in the above second embodiment, it is also possible to recognize captured image taken by sensors which are mounted on a plurality of vehicles moving on a road by a plurality of deep learning recognition units in the same manner. Since a plurality of vehicles are often moving at the same time in an actual case, a learning result synchronization unit 84 synchronizes the recognition results D621 to D62n of the deep learning recognition units 61 to 6n with the same time axis and outputs the final recognition result as D62.

For example, the 3D graphics composite image as shown in FIG. 13 is an image in which a plurality of vehicles are moving on a road, and the vehicles in the image are generated by a 3D graphics technique. It is possible to acquire an image from the view point of each individual vehicle by simulatively installing sensors on these vehicles. These 3D graphics composite images from the view point of these vehicles are input to the deep learning recognition units 61 to 6n to obtain recognition results.

Modification Example 2

Next, another modification example will be explained which makes use of a plurality of different types of sensors. While the sensors of the above modification example 1 are of the same type, for example, the same type of image sensors, a plurality of different types of sensors are installed in this modification example.

Figure 17:
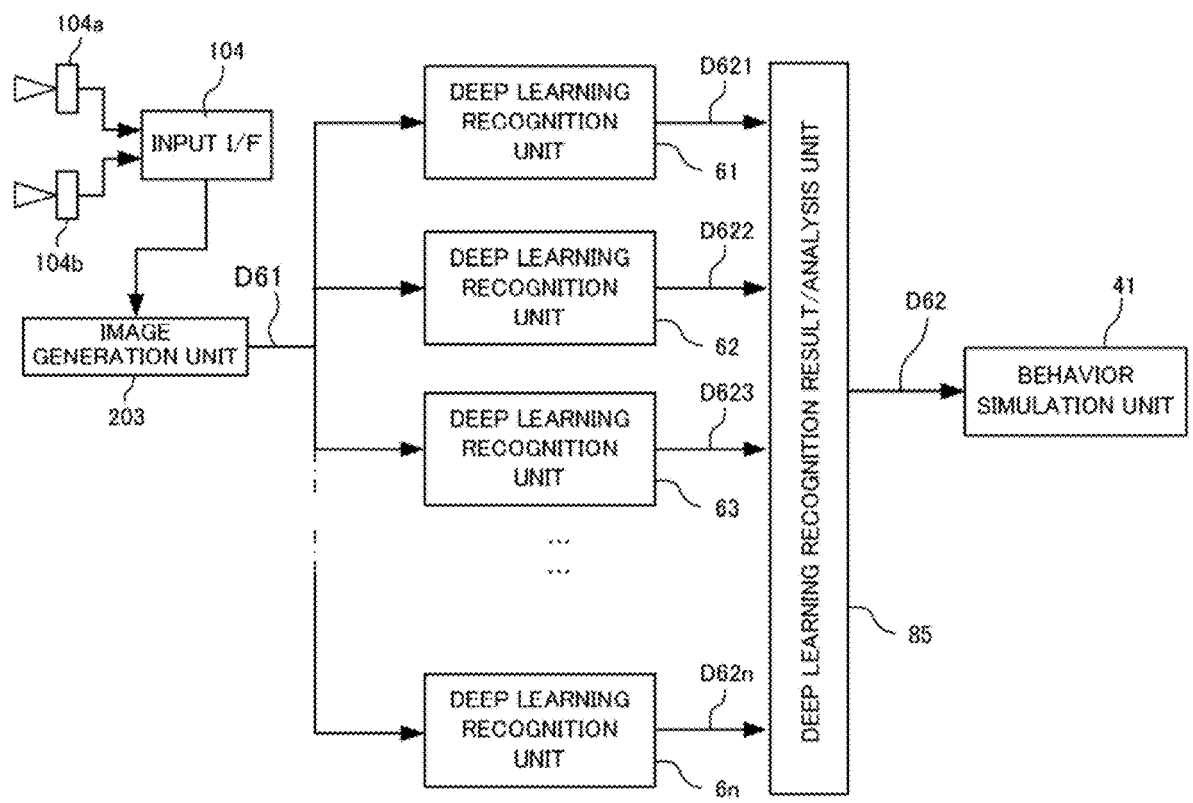
FIG. 17 is a view for explaining deep learning recognition and behavior simulation per formed by generating CG images with a plurality of sensors in the case of a modification example 2.

As shown in FIG. 17, specifically, a plurality of different types of vehicle mounted cameras 104a and 10b are connected to the input interface 104. In this case, the vehicle mounted camera 104a is a CMOS sensor or a CCD sensor camera which can take an image, in the same manner as in the above embodiments. On the other hand, the sensor 104b is a LiDAR (Light Detection and Ranging) which is a device which detects scattered light of laser radiation emitted in the form of pulses to measure the distances of remote objects. The LiDAR has attracted attention as one of indispensable sensors required for increasing precision of automatic driving.

The sensor 104b (LiDAR) makes use of near-infrared micropulse light (for example, wavelength of 905 nm) as the laser light, and includes for example a motor, mirrors and lenses for constructing a scanner and an optical system. On the other hand, a light receiving unit and a signal processing unit of the sensor receive reflected light and calculate a distance by signal processing.

Figure 18:
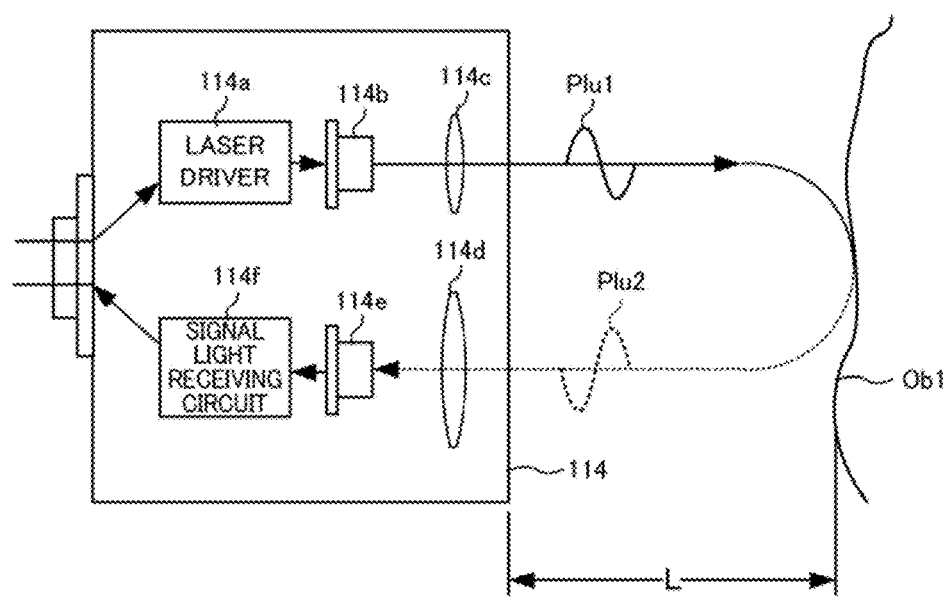
FIG. 18 is a view for explaining the operational mechanism of a LiDAR.

In this case, the LiDAR employs a LiDAR scan device 114 which is called TOF system (Time of Flight). This LiDAR scan device 114 outputs laser light as an irradiation pulse Plu1 from a light emitting element 114*b* through an irradiation lens 114*c* on the basis of the control by a laser driver 114*a* as illustrated in FIG. 18. This irradiation pulse Plu1 is reflected by a measurement object Ob1 and enters a light receiving lens 114*d* as a reflected pulse Plu2, and detected by a light receiving device 114*e*. The detection result of this light receiving device 114*e* is output from the LiDAR scan device 114 as an electrical signal through a signal light receiving circuit 114*f*. Such a LiDAR scan device 114 emits ultrashort pulses of a rising time of several nano seconds and a light peak power of several tens Watt to an object to be measured, and measures the time t required for the ultrashort pulses to reflect from the object to be measured and return to the light receiving unit. If the distance to the object is L and the velocity of light is c, the distance L is calculated by the following equation.

$$L=(c \times t)/2$$

Figure 19A:
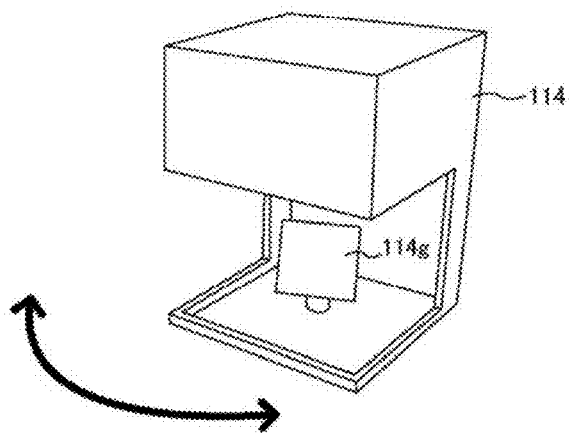
FIGS. 19A to 19C are views for explaining the mechanism of acquiring point group data of a LiDAR.
Figure 19B:
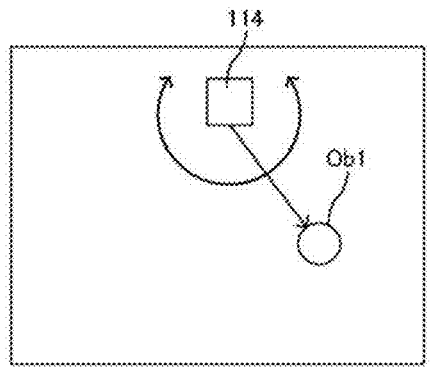
Figure 19C:
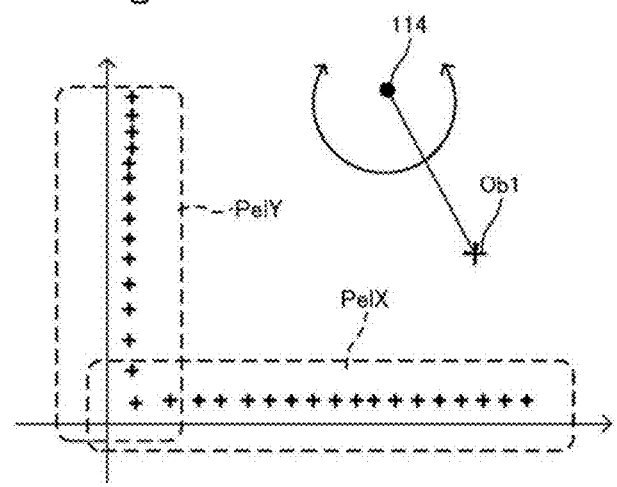
Figure 20:
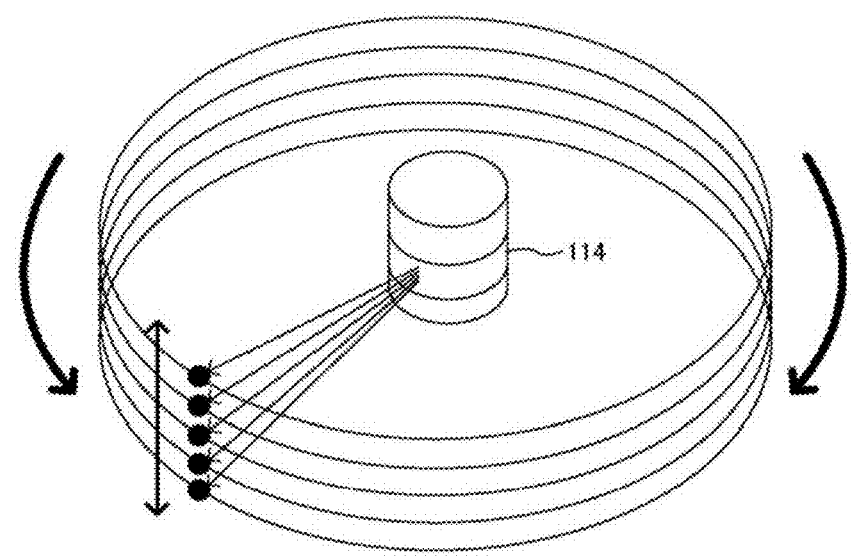
FIG. 20 is a view for explaining beam emission of a LiDAR sensor.

The basic operation of this LiDAR system is such that, as illustrated in FIGS. 19A to 19C, modulated laser light is emitted from the LiDAR scan device 114, and reflected by a rotating mirror 114*g*, distributed left and right or rotating by 360° for scanning, and that the laser light as reflected by the object is returned and captured by the LiDAR scan device 114 again. Finally, the captured reflected light is used to obtain point group data PelY and PelX indicating signal levels corresponding to rotation angles. Incidentally, for example, the LiDAR system which is of a rotary type can emit laser light by rotating a center unit as illustrated in FIG. 20 to performs 360-degree scanning.

Then, in the case of this modification example constructed as described above, the simulation image D61 as the 3D graphics synthesized image based on the video image taken by the image sensor 104*a* such as a camera is a two-dimensional image which is recognized by the deep learning recognition unit 6.

On the other hand, the point group data acquired by the light emitting element 114*b* is processed by a module additionally provided for processing the point group data in the image generation unit 203, which is provided with a function to generate a 3D point group data graphic image in the case of the present embodiment.

Then, with respect to the point group data acquired by the sensor 104*b*, the image generation unit 203 extracts sensor data acquired by the sensor 104*b*, and generates 3D point group data by calculating the distance to the object by the TOF mechanism with reference to reflected light as received on the basis of the extracted sensor data. This 3D point group data corresponds to a so-called distance image based on which the 3D point group data is converted to a 3D graphic image.

Figure 21:
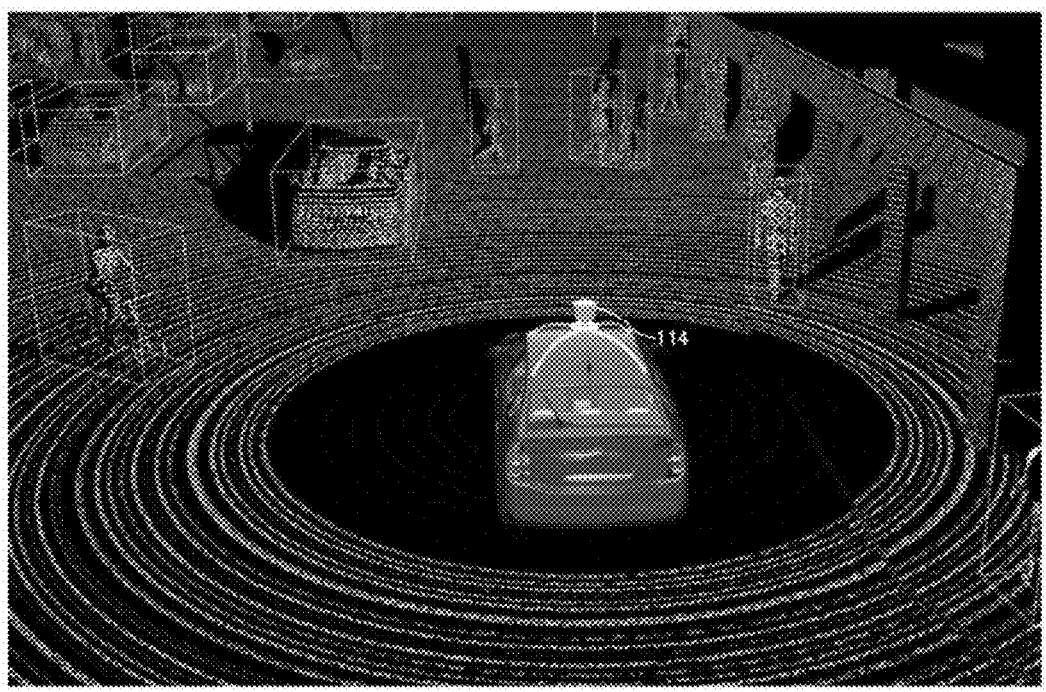
FIG. 21 is a view for explaining the mechanism of acquiring circumferential point group data generated by a LiDAR.

The 3D point group data graphic image obtained by imaging this 3D point group data may correspond to point group data which is obtained by emitting laser light to all directions of 360 degrees from a LiDAR installed, for example, on the running center vehicle shown in FIG. 20 and FIG. 21 and measuring the reflected light, and the intensity (density) of color indicates the intensity of the reflected light. Incidentally, the area such as a gap in which no substance exists is colored black because there is no reflected light.

As illustrated in FIG. 21, target objects such as an opposite running vehicle, a walker and a bicycle can be acquired from actual point group data as three-dimensional coordinate data, and therefore it is possible to easily generate 3D graphic images of these target objects. Specifically, the image generation unit 203 consistently processes point group data to generate a plurality of polygon data items by a 3D point group data graphics image generation function, and 3D graphics can be drawn by rendering these polygon data items.

Then, the 3D point group data graphic image as generated in this manner by the image generation unit 203 is input to the deep learning recognition unit 6 as a simulation image D61, and recognized by recognition means which has performed learning for 3D point group data in the deep learning recognition unit 6. By this configuration, different means is used than the deep learning recognition means which has performed learning with images for image sensors as described in the above embodiment. As a result, even if an oncoming vehicle is very far away so that it is likely that the vehicle cannot be acquired by an image sensor, the LiDAR can acquire the size and profile of the oncoming vehicle even at the front of several hundred meters so that the recognition precision can be improved.

As has been discussed above, in accordance with the above modification example, there are provided a plurality of sensors having different characteristics or different device properties, and an analysis unit 85 can analyze recognition results obtained with the outputs of the sensors by the deep learning recognition units 61 to 6*n*, and output the final recognition result D62.

Incidentally, this analysis unit 85 may be arranged outside, for example, in a network cloud. In this case, even in the case where the number of sensors per one vehicle dramatically increases in the future so that the computational load of the deep learning recognition process increases, it is possible to improve processing efficiency by performing processes, which can be handled outside through a network, by a cloud having a large scale computing power and feeding back the results.

Also, in the case of the embodiment of an image sensor, learning is performed by associating a segmentation map with objects in advance as illustrated in FIG. 11. This corresponds to two-dimensional images output from the image sensor.

On the other hand, in the case where the sensors include at least one LiDAR sensor, teacher data is set up with a plurality of reflectance values as detection items for each object such as a person, a vehicle, a traffic signal or a road obstacle. Then, for the deep learning recognition process as described above, in the case where the sensors include at least one LiDAR sensor, the image recognition means detects a plurality of reflectance values for each object such as a person, a vehicle, a traffic signal or a road obstacle.

Specifically describing, in the case of a LiDAR sensor, three-dimensional point group data is obtained as illustrated in FIG. 21. Accordingly, in the case of a LiDAR sensor, leaning is performed by associating a three-dimensional point group image with a reflectance value of laser light for each object. For example, in the case of the example shown in FIG. 21, association is set up as a vehicle with a reflectance of 1.5 to 2.0, a person on a bicycle with a reflectance of 1.1, an adult walker with a reflectance of 0.8, a child walker with a reflectance of 0.6, a road with a reflectance of 0.2 to 0.5 and so forth.

Incidentally, while virtual CG images are generated in the case of the example shown in FIG. 16, as has been discussed in the first embodiment, it is possible to perform deep learning recognition by installing this application system in an actual vehicle (like car navigation system) and inputting information to the system from different types of sensors while actually imaging and driving the vehicle. FIG. 17 is a block diagram for showing an actual case of such a system.

Also, it is assumed in the case of the present modification example that the object imaging devices are a LiDAR sensor and a millimeter wave sensor as described above besides the image sensor of a vehicle mounted camera. In the case of the image sensor, a high quality CG image is generated by a PBR technique as described in the first embodiment with reference to parameters such as light information extracted from a photographed image as acquired, and the CG image is output from the image generation unit 203. On the other hand, in the case of the LiDAR sensor, a three-dimensional point group data is generated from the reflected light of laser light which is a beam emitted from the LiDAR sensor actually mounted on a vehicle. Then, an image as a 3D CG converted from this three-dimensional point group data is output from the above image generation unit 203.

In this way, CG images corresponding to a plurality of types of sensors are emitted from the image generation unit 203, and the recognition process thereof is performed in each deep learning recognition unit of FIG. 17 by predetermined means. Also, while the above modification example has been explained with a LiDAR sensor as an example, it is also effective to make use of a millimeter wave sensor or an infrared sensor which is particularly effective in the night.

EXPLANATION OF SYMBOLS

B1-B3 . . . building
C1, C2 . . . character
M1 . . . real map information
M11 . . . contour generation image
M12 . . . contour line extraction image
M2 . . . virtual map information
M22, M23 . . . low resolution map
M22a, M23a . . . boundary area
O1-O3 . . . object
Ob10 . . . background object
W1 . . . real display data
W2 . . . virtual display data
1 (1a, 1b) . . . smartphone
2 . . . Internet
3 . . . game server
10a, 10b . . . user
11 . . . communication interface
12 . . . input interface
12a . . . touch panel
13 . . . output interface
13a . . . display
14 . . . application running unit
15 . . . memory
21 . . . satellite
22 . . . wireless base station
31 . . . communication interface
32 . . . positional information management unit
33 . . . authentication unit
34 . . . game data delivering unit
35a . . . real map database
35b . . . user database
35c . . . game database
36 . . . game progress processing unit
37 . . . virtual map information management unit
141 . . . game progress processing unit
142 . . . synchronization processing unit
143 . . . event control unit
144 . . . positional information acquisition unit
145 . . . display control unit
146 . . . display data generation unit

What is claimed is:

1. A simulation system of a plurality of recognition function modules for a real image varying in correspondence with position shifting information of a plurality of vehicles, comprising:
   a positional information acquisition unit which acquires, in a plurality of client devices, a plurality of positional information of the plurality of vehicles;
   an image generation unit which generates, in a simulator server, a simulation image for reproducing an area specified by the plurality of positional information on the basis of the plurality of positional information acquired by the positional information acquisition unit;
   an image recognition unit which recognizes and detects, in a simulator server, a particular object for each of the plurality of vehicles by the plurality of recognition function modules in the simulation image generated by the image generation unit;
   a positional information calculation unit which generates, in the plurality of client devices, a control signal for controlling behavior of the plurality of vehicles by the use of the recognition result of the image recognition unit for each of the plurality of vehicles, and changes/modifies the plurality of positional information of the plurality of vehicles on the basis of the generated control signal; and
   a synchronization control unit which controls synchronization among the positional information acquisition unit of the plurality of client devices, the image generation unit of the simulator server, the image recognition unit of the simulator server and the positional information calculation unit of the plurality of client devices.

2. A simulation system of a plurality of recognition function modules for a real image varying in correspondence with position shifting information of a plurality of vehicles, comprising:
   a positional information acquisition unit which acquires, in a plurality of client devices, a plurality of positional information of the plurality of vehicles;
   an image generation unit which generates, in a simulator server, 3D graphics images for reproducing an area specified by the plurality of positional information on the basis of the plurality of positional information acquired by the positional information acquisition unit;
   an image recognition unit which recognizes and detects, in a simulator server, a particular object for each of the plurality of vehicles by the plurality of recognition function modules in the 3D graphics images generated by the image generation unit to perform deep learning recognition and outputs a deep learning recognition result for each sensor unit;
   a positional information calculation unit which generates, in the plurality of client devices, a control signal for controlling behavior of the plurality of vehicles by the use of the recognition result of the image recognition unit for each of the plurality of vehicles, and changes/modifies the plurality of positional information of the plurality of vehicles on the basis of the generated control signal; and
   a synchronization control unit which controls synchronization among the positional information acquisition unit of the plurality of client devices, the image generation unit of the simulator server, the image recognition unit of the simulator server and the positional information calculation unit of the plurality of client devices on the basis of a deep learning recognition result of each sensor unit, wherein the simulator server is connected with the plurality of client devices through the communication network.

3. The simulation system of claim 1 wherein the synchronization control unit comprises:
   a unit of packetizing the plurality of positional information in a particular format and transmitting the packetized plurality of positional information;
   a unit of transmitting the packetized data through a network or a transmission bus in a particular device;
   a unit of receiving and depacketizing the packetized data; and
   a unit of receiving the depacketized data and generating an image.

4. The simulation system of claim 1 wherein
   the synchronization control unit transmits and receives signals among the respective units in accordance with UDP (User Datagram Protocol).

5. The simulation system of claim 1 wherein
   the plurality of positional information of the plurality of vehicles includes information about any of XYZ coordinates of road surface absolute position coordinates of the plurality of vehicles, XYZ coordinates of road surface absolute position coordinates of tires, Euler angles of the plurality of vehicles and a wheel rotation angle.

6. The simulation system of claim 1 wherein
   the image generation unit is provided with a unit of synthesizing a three-dimensional profile of the plurality of vehicles by computer graphics to generate the simulation image.

7. The simulation system of claim 1 wherein
   the image recognition unit is a deep learning recognition unit comprising a multi-stage neural network.

8. The simulation system of claim 1 wherein the image recognition unit further comprises:
   a segmentation unit which performs area division of specific objects to be recognized in the simulation image; and
   a teacher data creation unit which create teacher data for learning on the basis of the images corresponding to the areas divided by the segmentation unit.

9. The simulation system of claim 8 wherein
   in the case where the sensors acquiring the real image include at least one LiDAR sensor, teacher data is set up with a plurality of reflectance values as detection items for each object such as a person, a vehicle, a traffic signal or a road obstacle.

10. The simulation system of claim 1 wherein
    the image generation unit is provided with a unit of generating a different image for each sensor unit acquiring the real image.

11. The simulation system of claim 1 wherein
    there is provided, as the sensor unit acquiring the real image, with any or all of an image sensor, a LiDAR sensor, a millimeter wave sensor and an infrared sensor.

12. The simulation system of claim 2 wherein
    in the case where the sensors include at least one LiDAR sensor, the image recognition unit uses, as detection subjects, a plurality of reflectance values as detection items for each object such as a person, a vehicle, a traffic signal or a road obstacle.

13. The simulation system of claim 1 wherein
    the simulation image is a virtual CG image generated by a CG technique.

14. The simulation system of claim 1 further comprising:
    an annotation generation unit which furnishes, in a simulator server, meta data as a commentary note for the particular object detected by the image recognition unit.

* * * * *